United States Patent
Yang et al.

(10) Patent No.: US 11,551,781 B1
(45) Date of Patent: Jan. 10, 2023

(54) PROGRAMMING MEMORY CELLS WITH CONCURRENT STORAGE OF MULTI-LEVEL DATA AS SINGLE-LEVEL DATA FOR POWER LOSS PROTECTION

(71) Applicant: SanDisk Technologies LLC, Addison, TX (US)

(72) Inventors: Xiang Yang, Santa Clara, CA (US); Toru Miwa, Yokohama (JP); Ken Oowada, Fujisawa (JP); Gerrit Jan Hemink, San Ramon, CA (US)

(73) Assignee: SanDisk Technologies LLC, Addison, TX (US)

(*) Notice: Subject to any disclaimer, the term of this patent is extended or adjusted under 35 U.S.C. 154(b) by 28 days.

(21) Appl. No.: 17/349,321

(22) Filed: Jun. 16, 2021

(51) Int. Cl.
*G11C 16/26* (2006.01)
*G11C 29/00* (2006.01)
*G11C 29/02* (2006.01)
*G11C 16/34* (2006.01)
*G11C 16/10* (2006.01)

(52) U.S. Cl.
CPC .......... *G11C 29/789* (2013.01); *G11C 16/102* (2013.01); *G11C 16/26* (2013.01); *G11C 16/3459* (2013.01); *G11C 29/021* (2013.01)

(58) Field of Classification Search
CPC ..... G11C 29/789; G11C 16/102; G11C 16/26; G11C 16/3459; G11C 29/021
See application file for complete search history.

(56) References Cited

U.S. PATENT DOCUMENTS

| | | |
|---|---|---|
| 8,289,798 B2 | 10/2012 | Coteus et al. |
| 10,153,046 B1 | 12/2018 | Agarwal et al. |
| 10,242,734 B1 | 3/2019 | Khakifirooz et al. |
| 10,607,702 B1 * | 3/2020 | Bonitz ............... G11C 11/5671 |
| 10,726,922 B2 | 7/2020 | Yang et al. |
| 10,811,109 B2 | 10/2020 | Baraskar et al. |
| 10,978,156 B2 | 4/2021 | Yang et al. |

OTHER PUBLICATIONS

Non-final Office Action dated Aug. 18, 2022, U.S. Appl. No. 17/349,306, filed Jun. 16, 2021.
U.S. Appl. No. 17/349,306, filed Jun. 16, 2021.

* cited by examiner

*Primary Examiner* — Xiaochun L Chen
(74) *Attorney, Agent, or Firm* — Vierra Magen Marcus LLP

(57) ABSTRACT

Apparatuses and techniques are described for programming data in memory cells while concurrently storing backup data. Initial pages of multiple bit per cell data are encoded to obtain at least first and second pages of single bit per cell data. The initial pages of multiple bit per cell data are programmed into a primary set of memory cells, while concurrently the first and second pages of single bit per cell data are programmed into first and second backup sets of memory cells, respectively. In the event of a power loss, the first and second pages of single bit per cell data are read from the first and second backup sets of memory cells, and decoded to recover the initial pages of multiple bit per cell data.

20 Claims, 27 Drawing Sheets

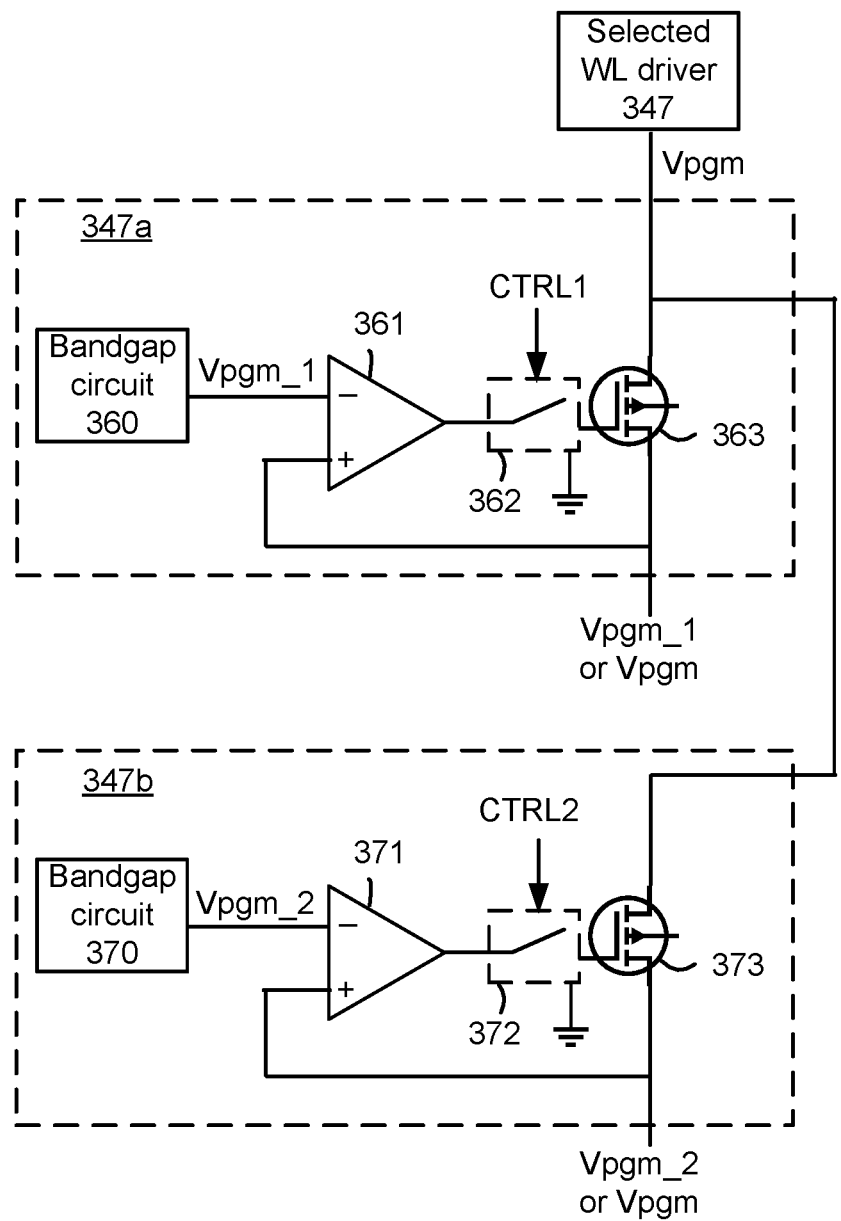

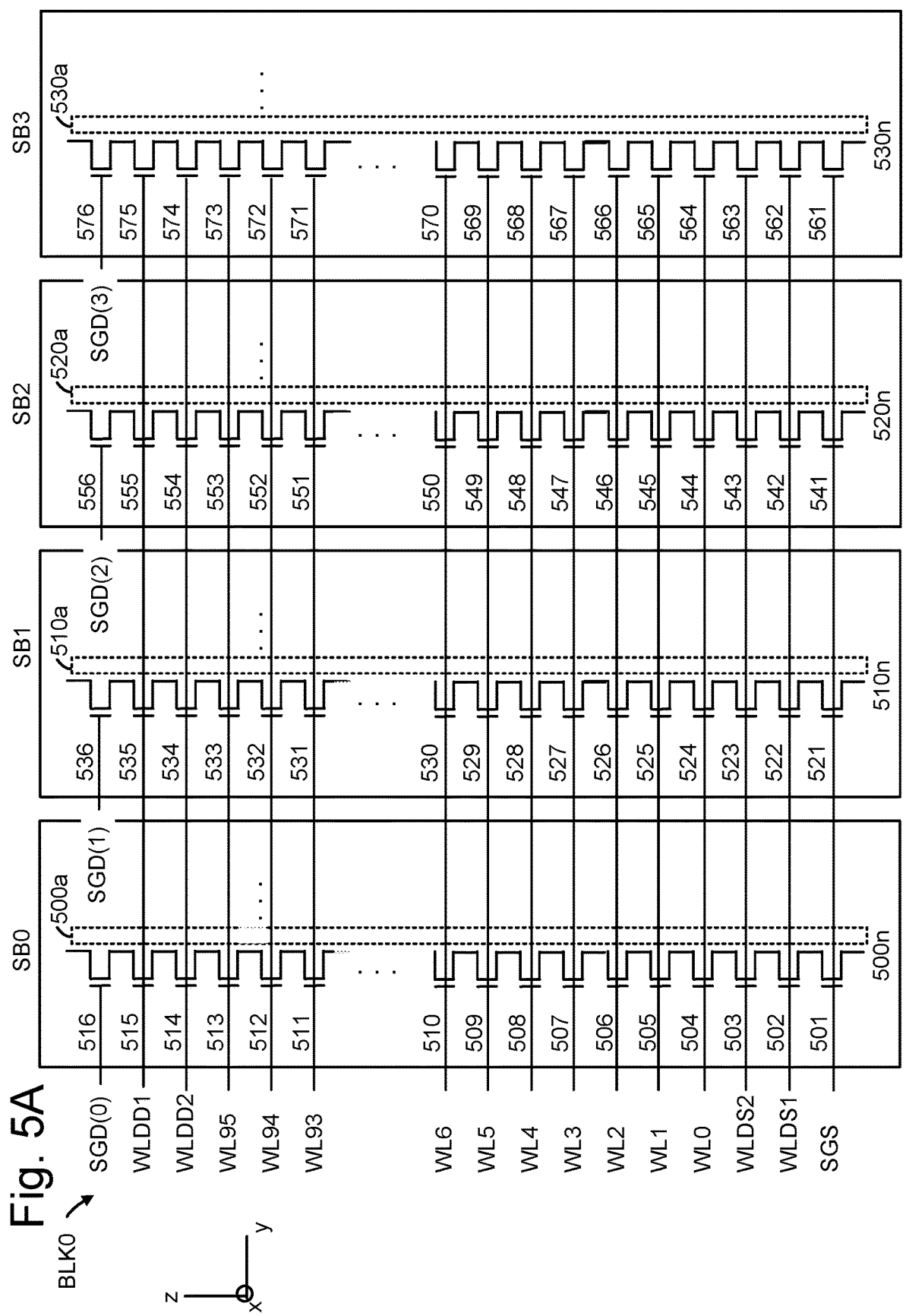

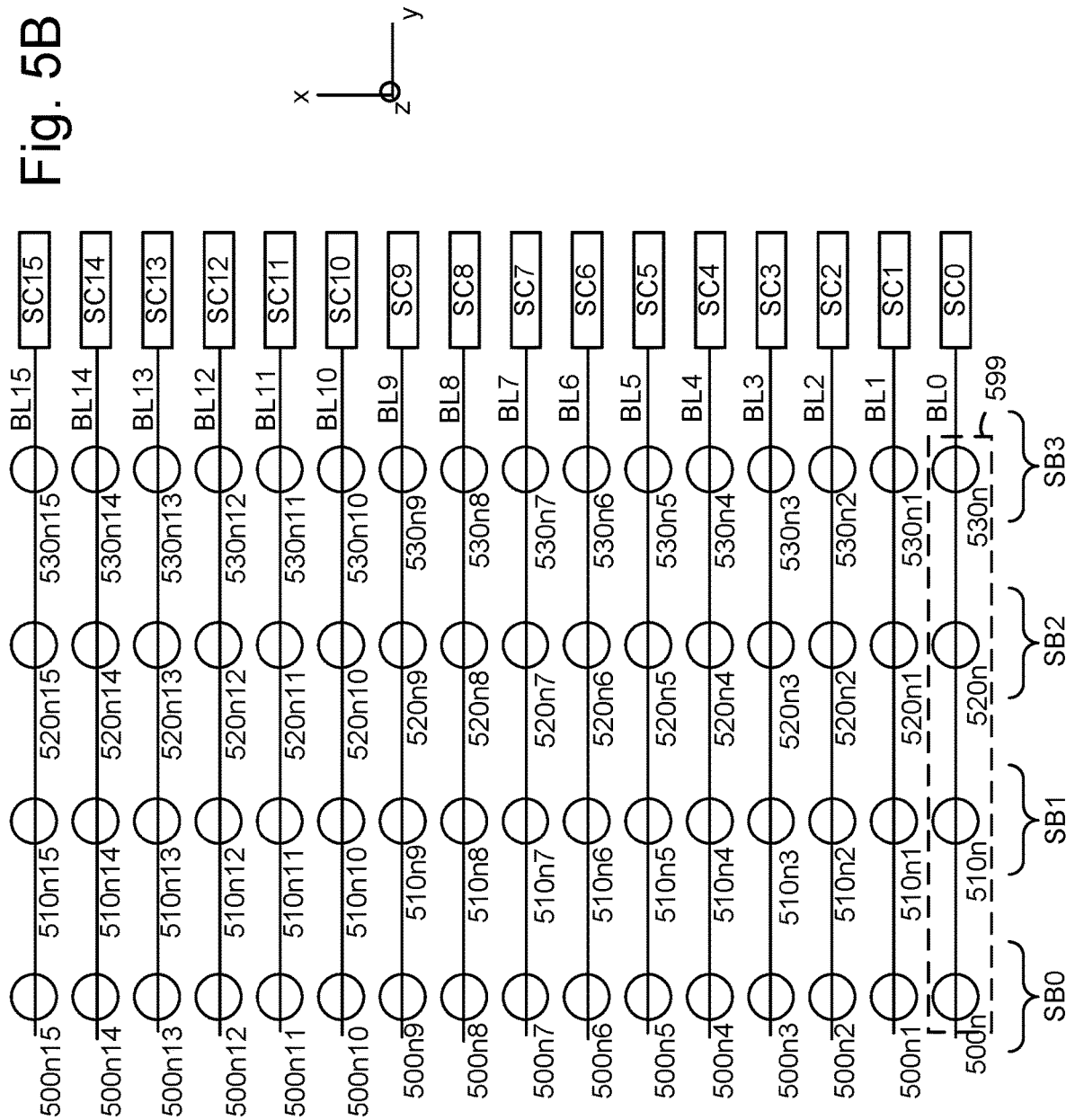

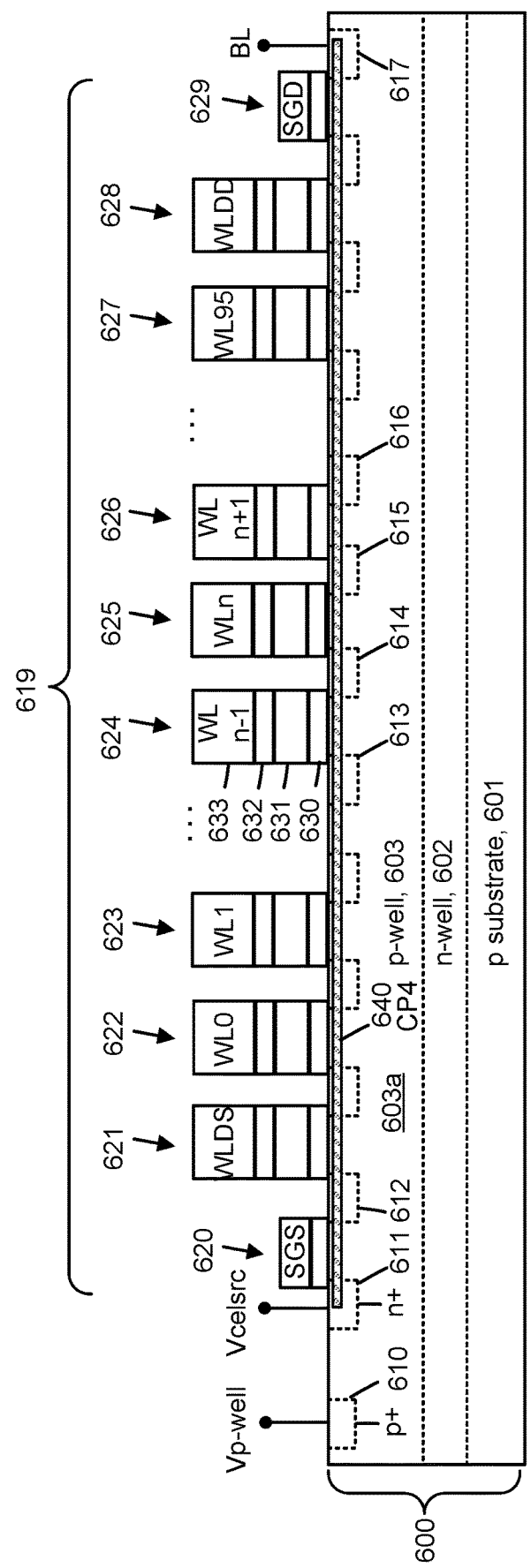

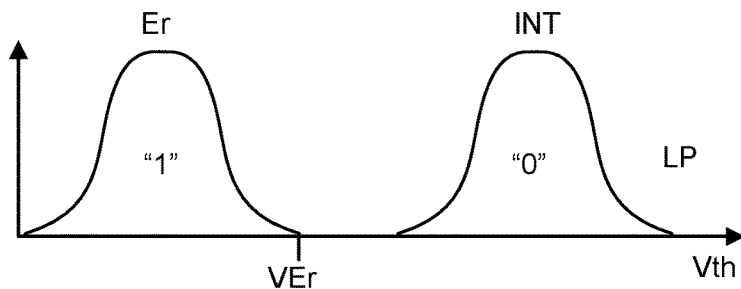
Fig. 7A
Fig. 7B
Fig. 7C
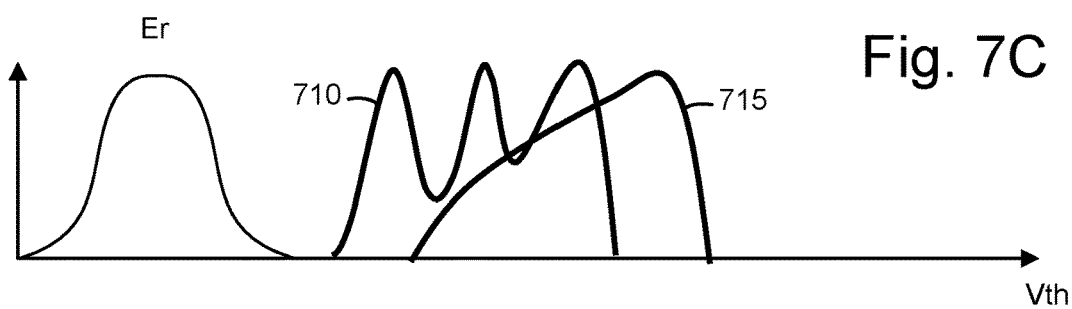
Fig. 8A
Fig. 8B
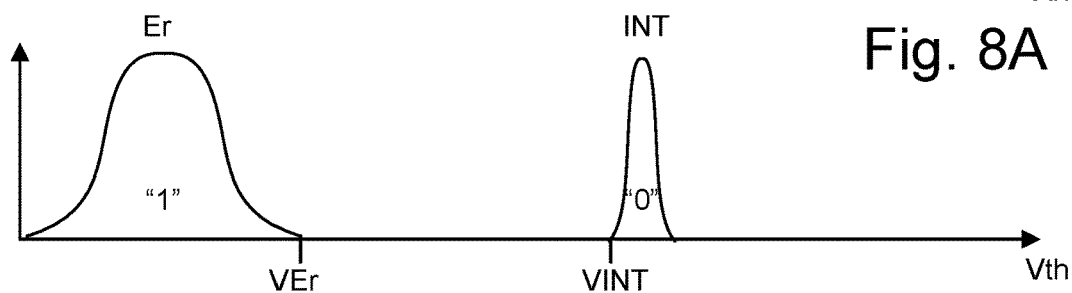
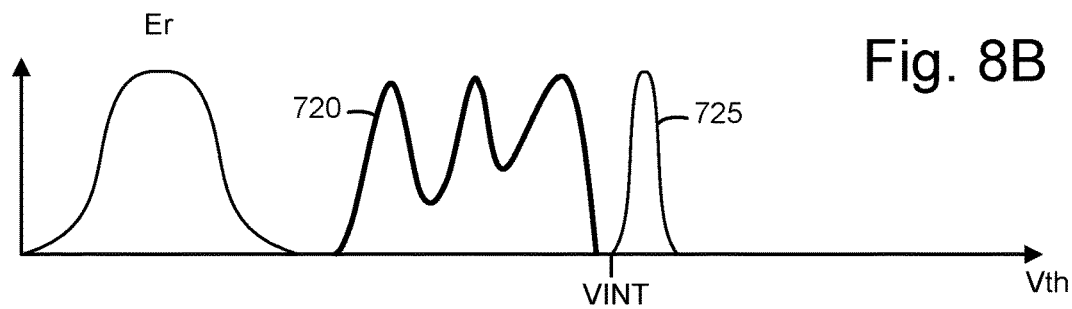
Fig. 9

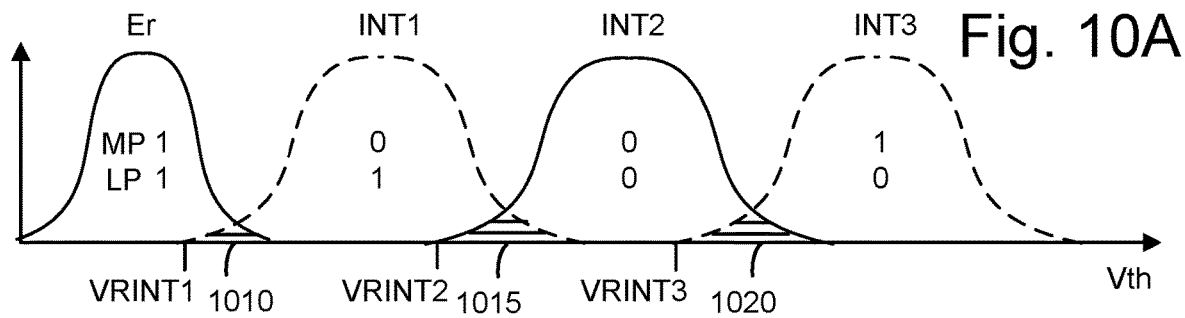
Fig. 10A
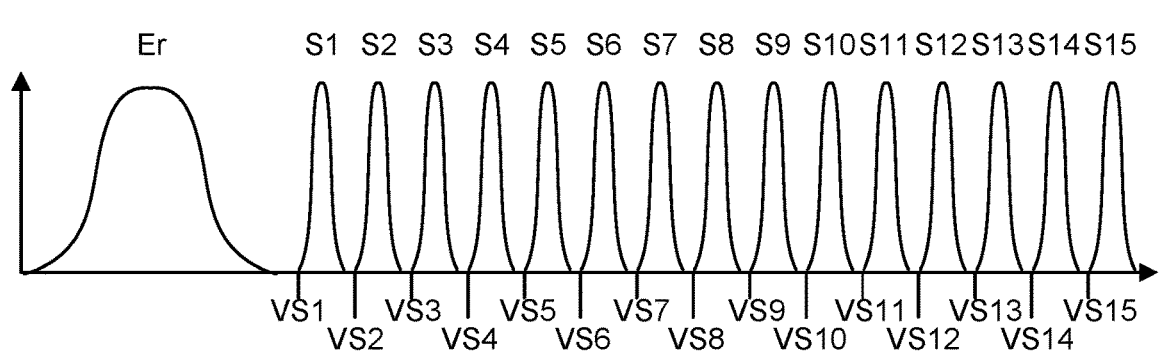
Fig. 10B
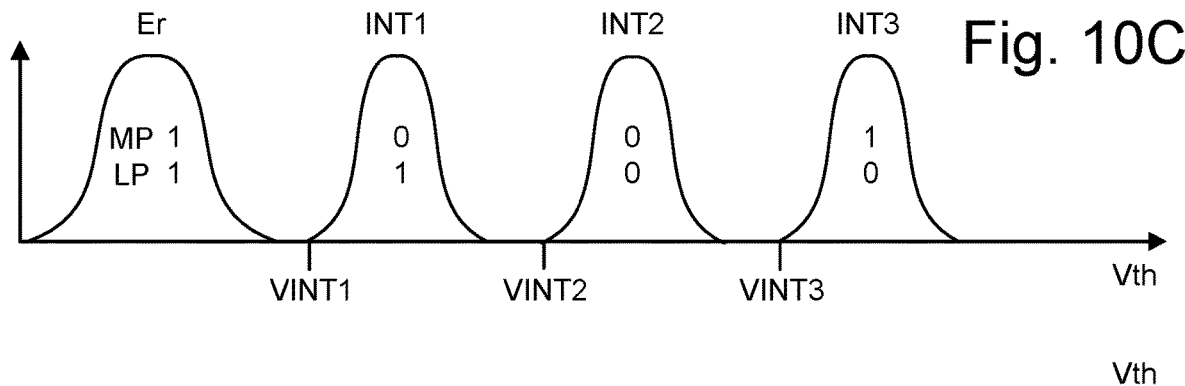
Fig. 10C
Fig. 11
| Page | Er/S0 | S1 | S2 | S3 | S4 | S5 | S6 | S7 | S8 | S9 | S10 | S11 | S12 | S13 | S14 | S15 |
|------|-------|----|----|----|----|----|----|----|----|----|----|----|----|----|----|----|
| TP | 1 | 0 | 0 | 1 | 1 | 1 | 0 | 0 | 0 | 0 | 1 | 1 | 1 | 0 | 0 |
| UP | 1 | 1 | 0 | 0 | 0 | 1 | 1 | 1 | 0 | 0 | 0 | 0 | 1 | 1 | 0 |
| MP | 1 | 1 | 1 | 1 | 0 | 0 | 0 | 0 | 0 | 0 | 0 | 1 | 1 | 1 | 1 |
| LP | 1 | 1 | 1 | 1 | 1 | 1 | 0 | 0 | 1 | 1 | 0 | 0 | 0 | 0 | 0 |

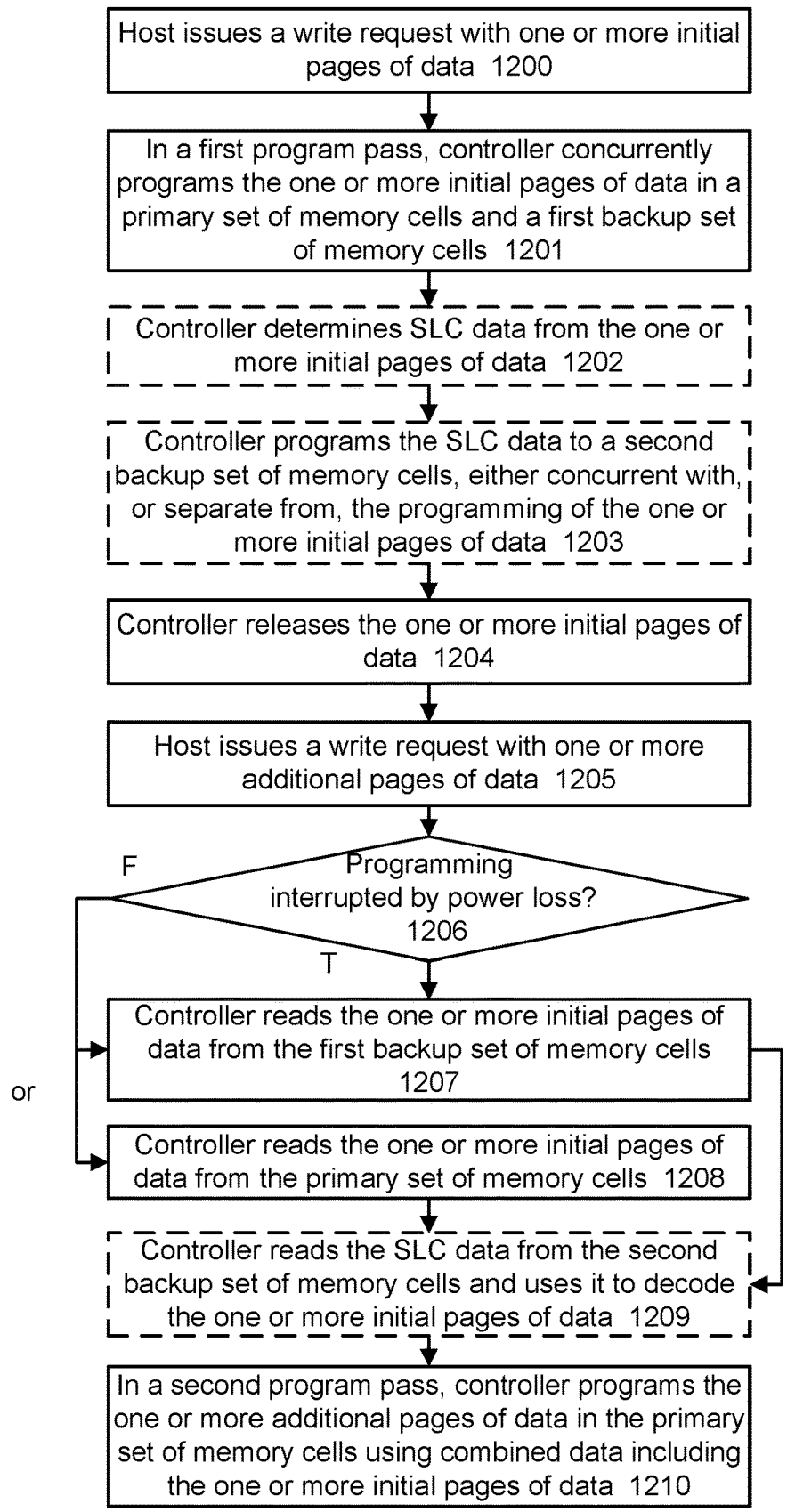

Fig. 12B
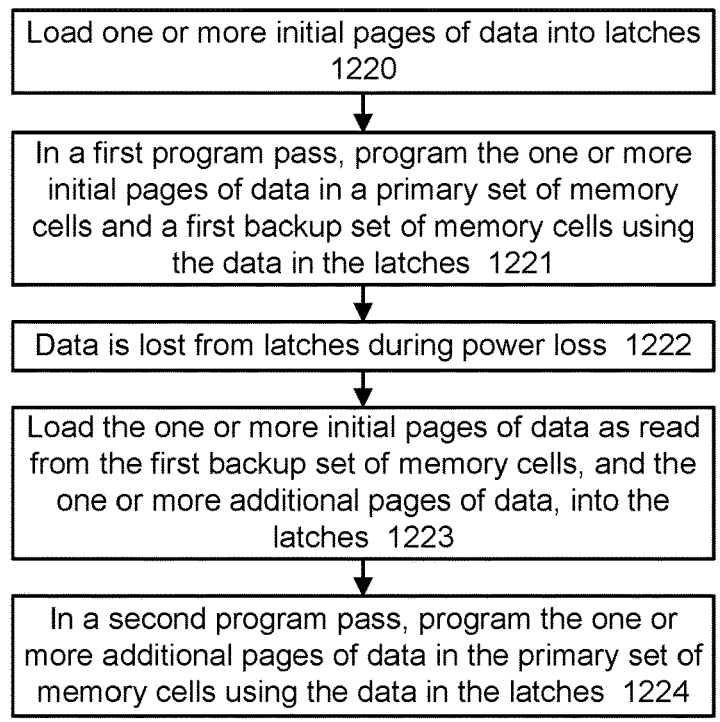
Fig. 13A
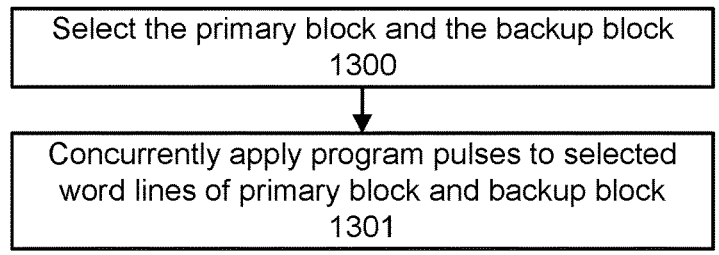
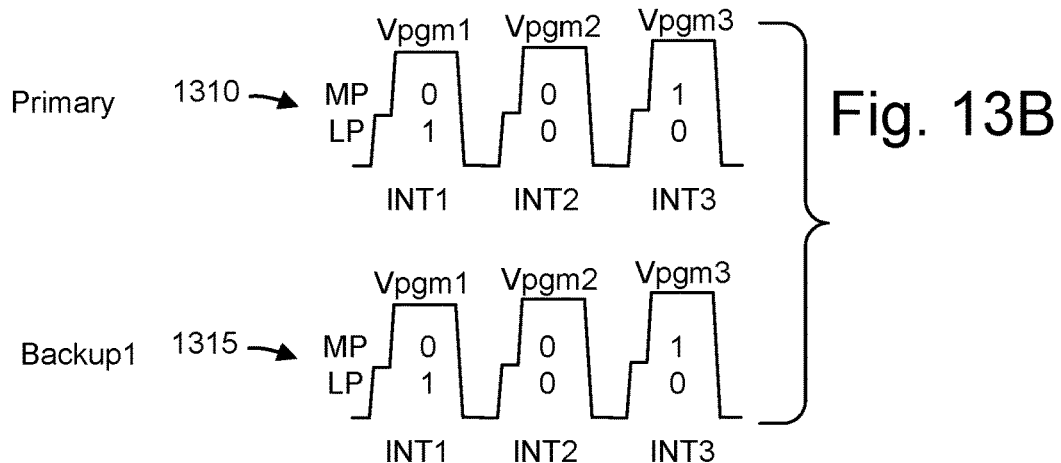
Fig. 13B

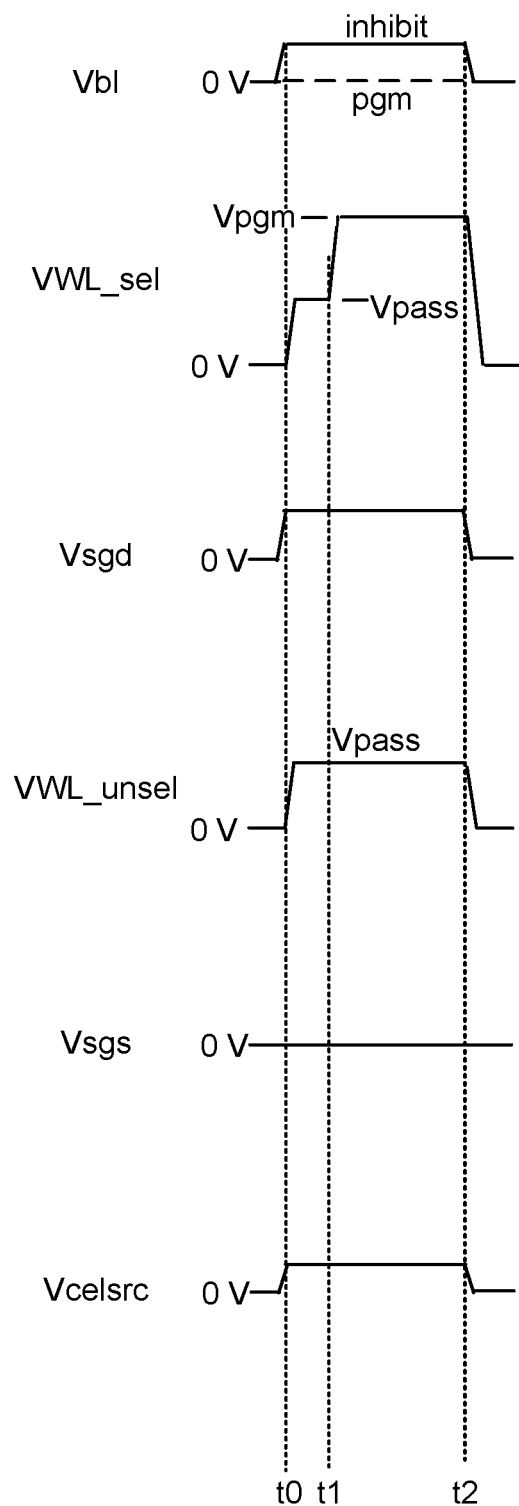

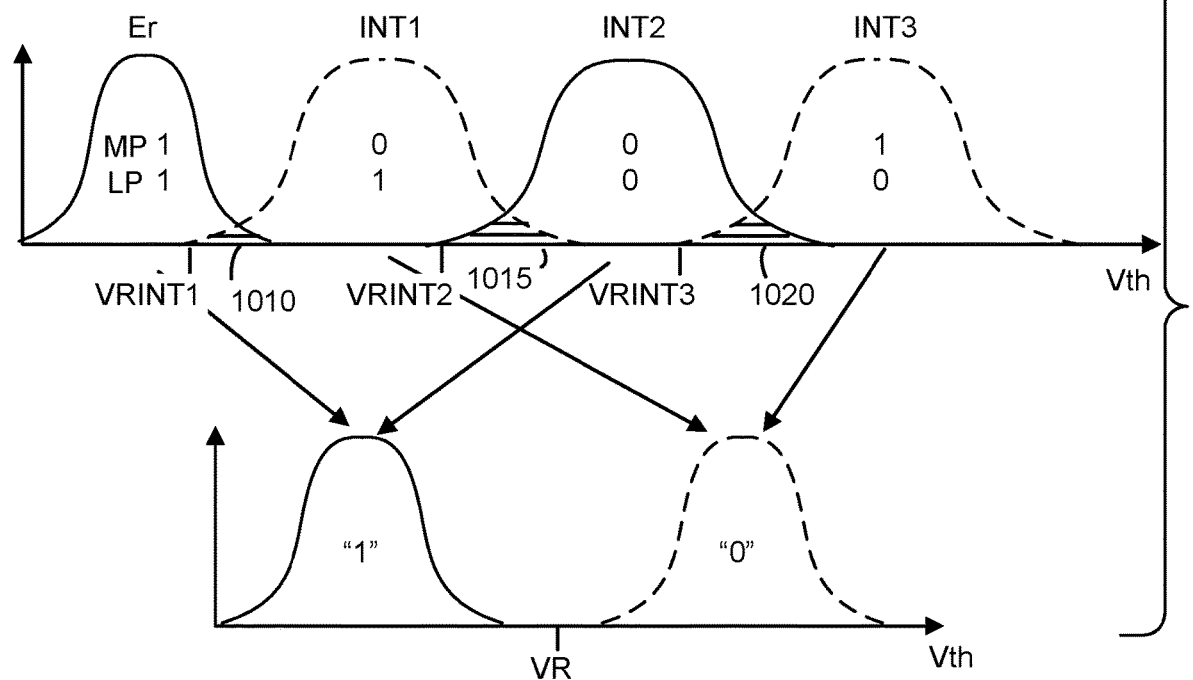

Fig. 16D

```
Select the primary block and the first backup block
1610
           ↓
Concurrently apply first program pulse, Vpgm1, to
selected word lines of the primary block and the
first backup block  1611
           ↓
Concurrently apply second program pulse, Vpgm2,
to selected word lines of the primary block and the
first backup block  1612
           ↓
Concurrently apply third program pulse, Vpgm3, to
selected word lines of the primary block and the
first backup block  1613
           ↓
Select second backup block  1614
           ↓
Apply fourth program pulse, Vpgm4, to a selected
word line of the second backup block  1615
```

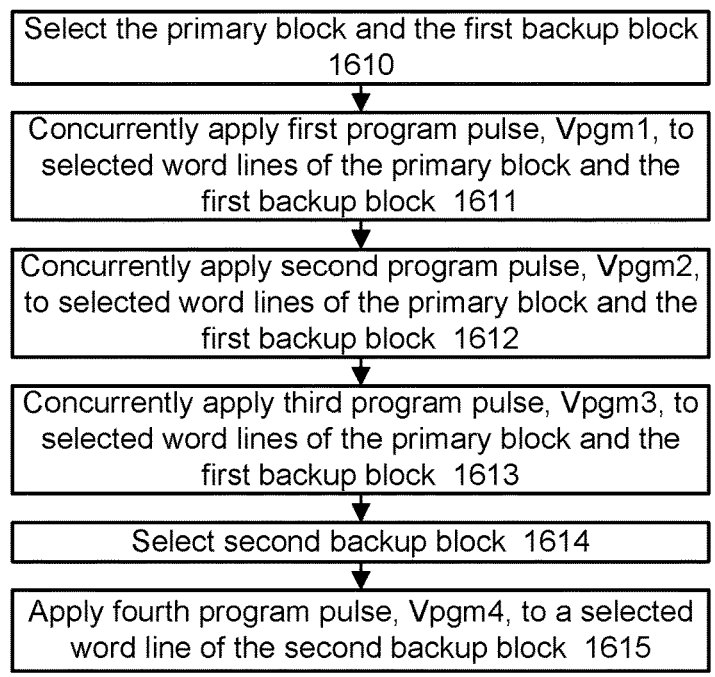

Fig. 16E

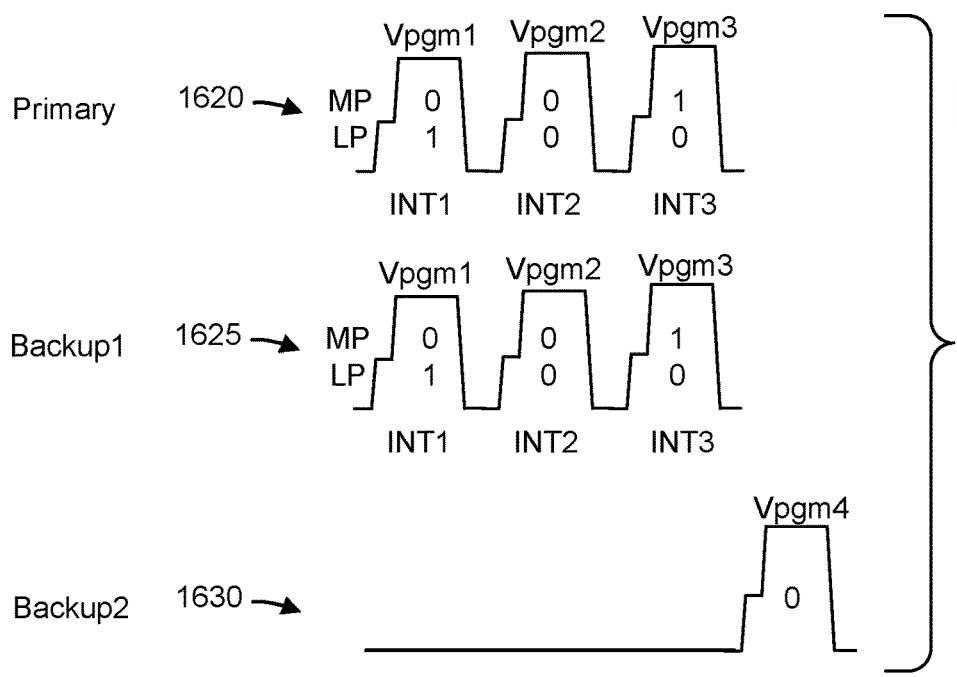

Fig. 16F

Fig. 17A
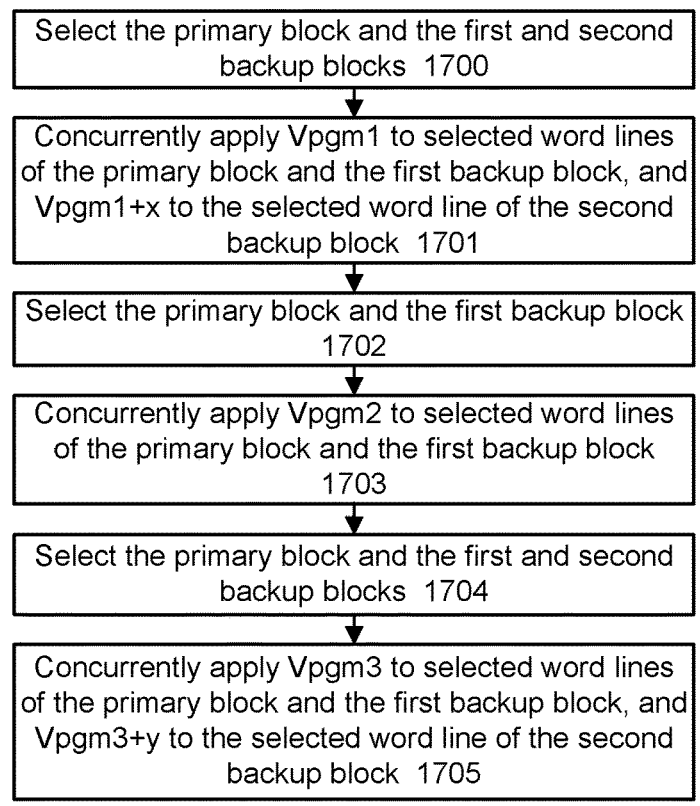
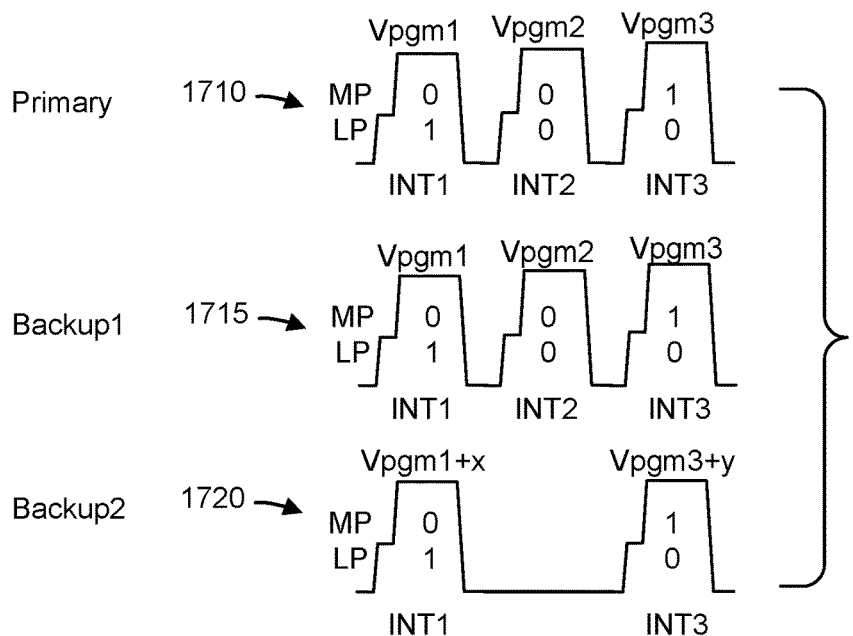
Fig. 17B
Fig. 17C

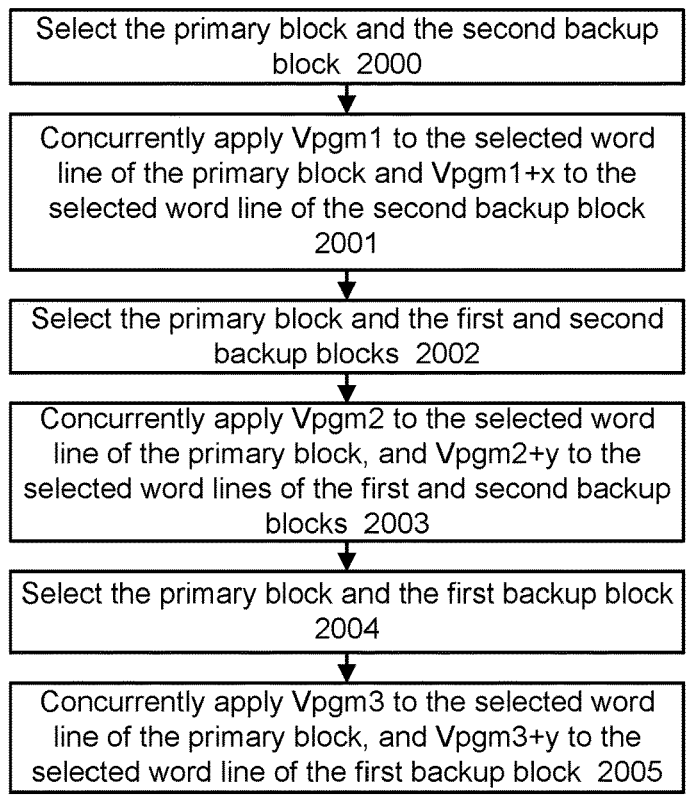
Fig. 20A
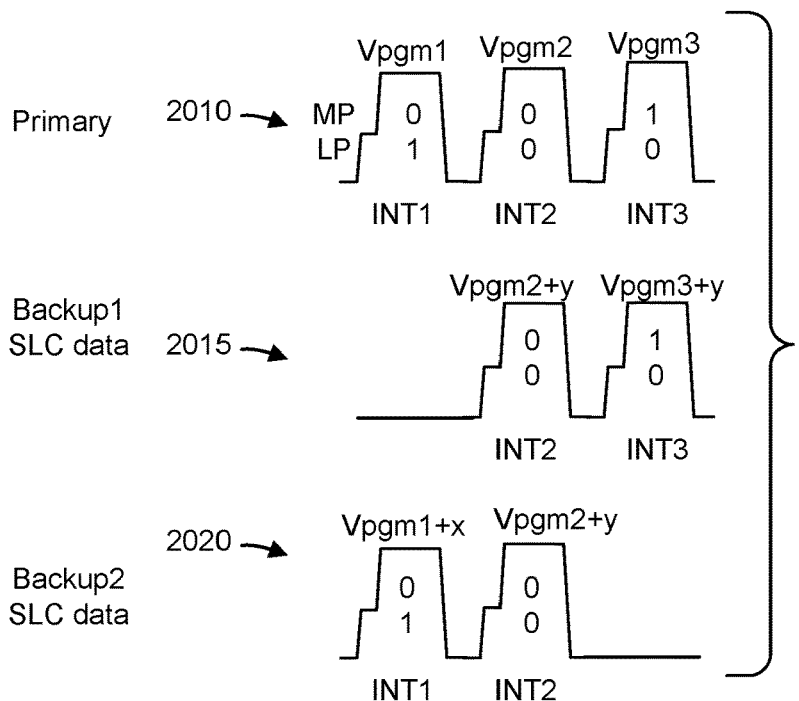
Fig. 20B
Fig. 20C

Fig. 22A
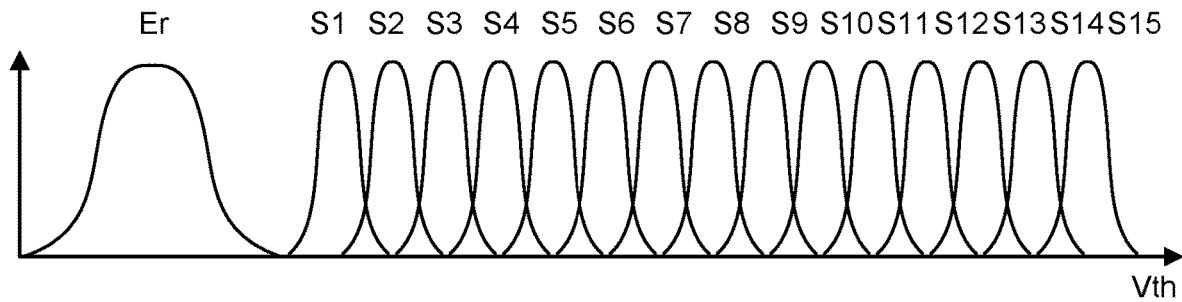
Fig. 22B
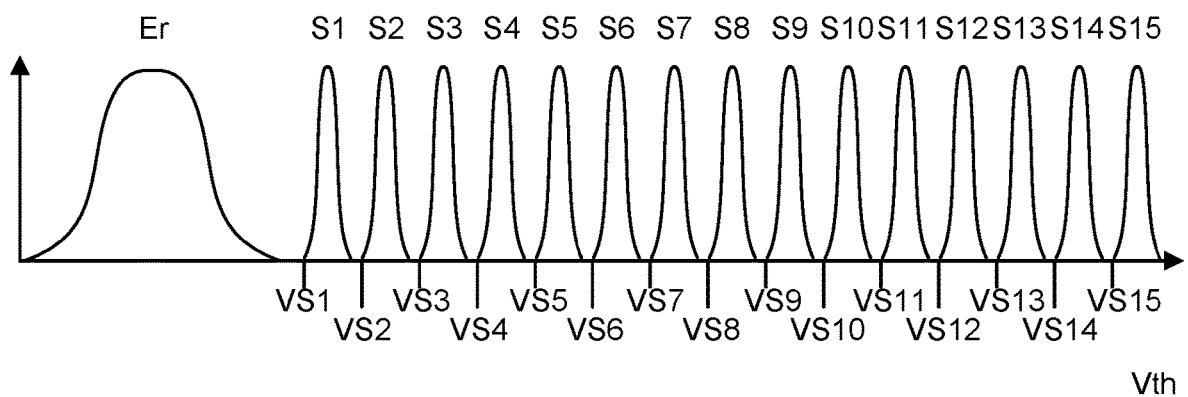
Fig. 22C
| Page | Er/S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 1 | 1 | 1 | 1 | 0 | 0 |

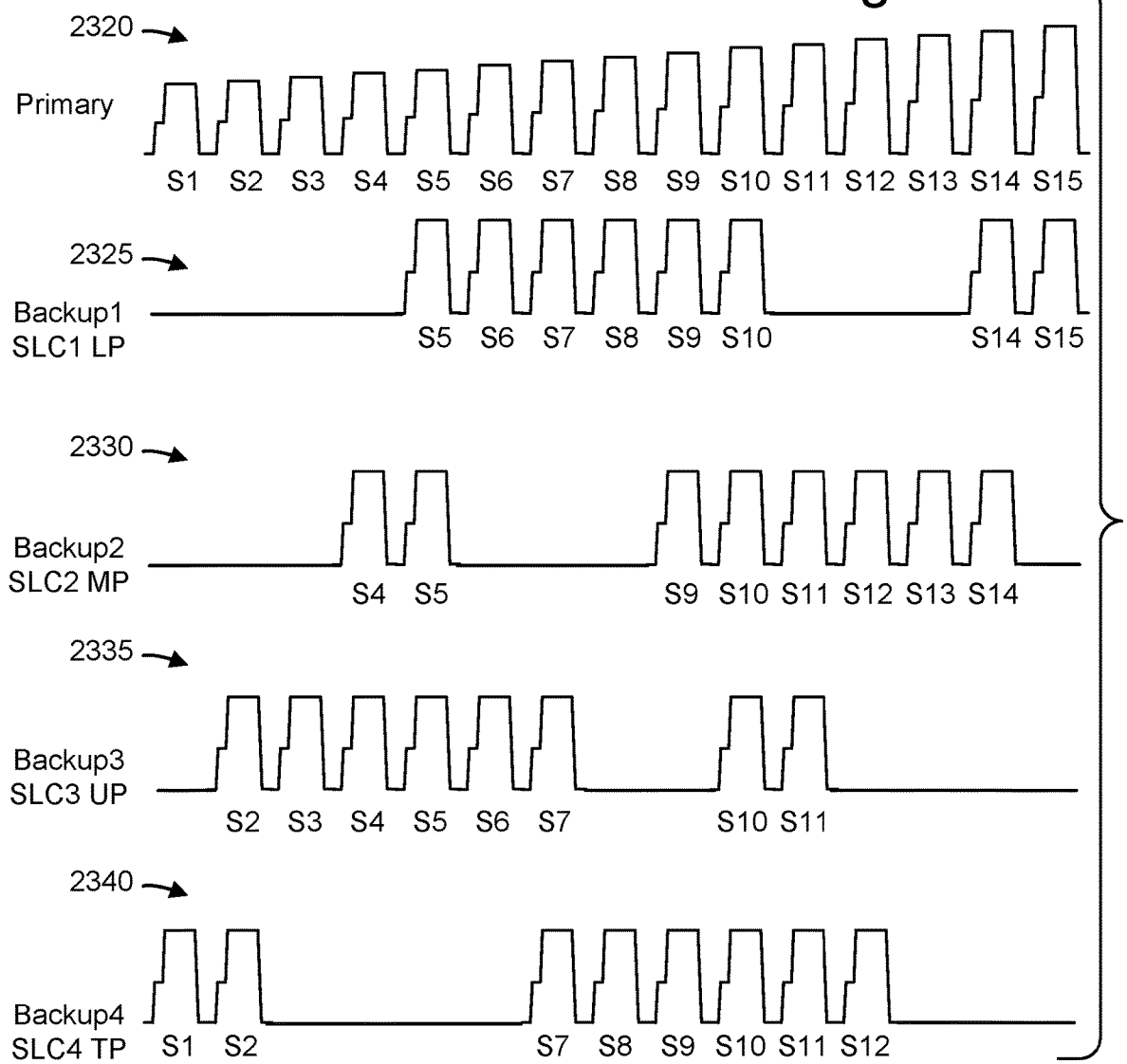

Fig. 24A
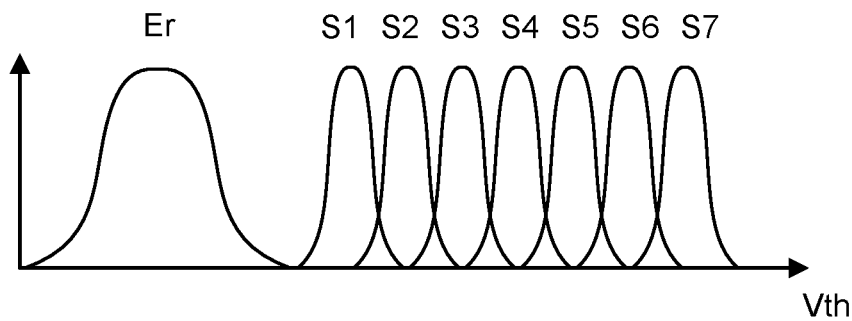
Fig. 24B
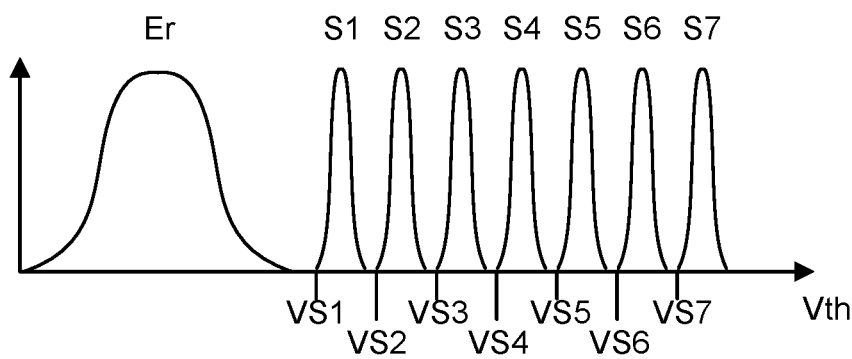
Fig. 24C
| Page | Er/S0 | S1 | S2 | S3 | S4 | S5 | S6 | S7 |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

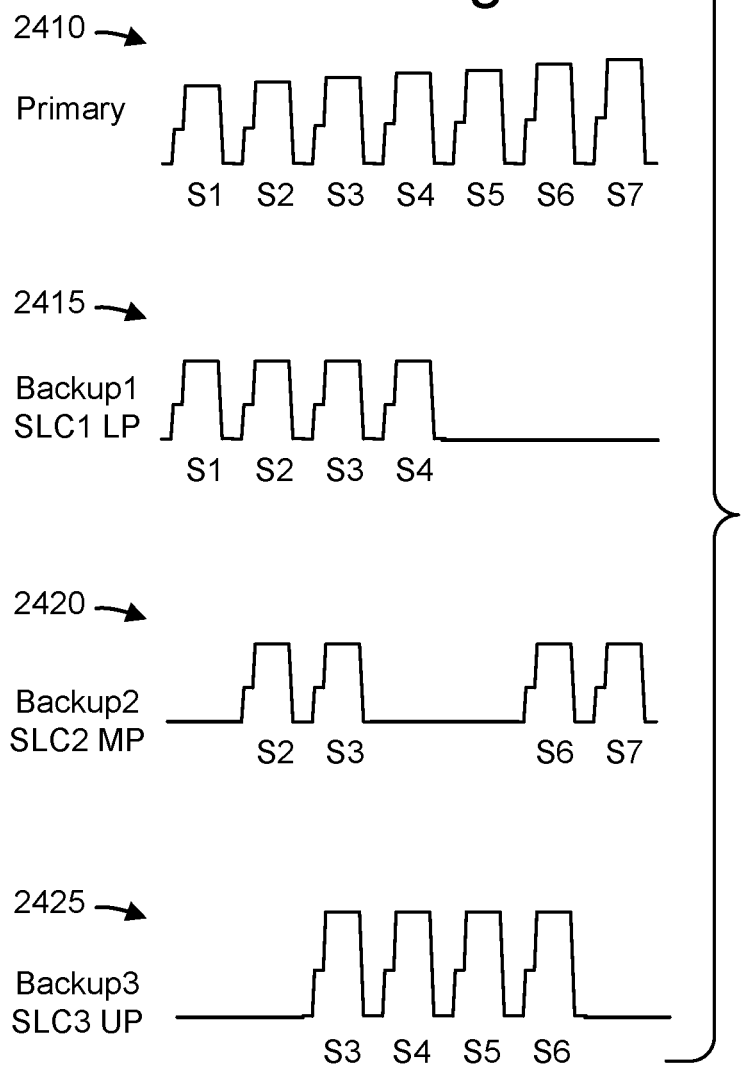

PROGRAMMING MEMORY CELLS WITH CONCURRENT STORAGE OF MULTI-LEVEL DATA AS SINGLE-LEVEL DATA FOR POWER LOSS PROTECTION

CROSS-REFERENCE TO RELATED APPLICATIONS

This application is related to U.S. patent application Ser. No. 17/349,306, titled "Programming Memory Cells With Concurrent Redundant Storage Of Data For Power Loss Protection," to Yang et al. filed herewith on Jun. 16, 2021.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 3B depicts an example implementation of the voltage regulators 347a and 347b of FIG. 3A.

FIG. 5A depicts an example view of NAND strings in BLK0 which is consistent with FIG. 4.

FIG. 5B depicts an example top view of BLK0 of FIG. 5A, with respective NAND strings, bit lines and sense circuits.

FIG. 6 depicts an example NAND string in a 2D configuration.

FIG. 7A depicts threshold voltage (Vth) distributions representing an erased (Er) state and an intermediate (INT) state after a first program pass of a program operation, where the INT state is reached without a verify test.

FIG. 7B depicts threshold voltage distributions representing the erased (Er) state and programmed states S1-S7 after a successful second program pass of a program operation which follows the first program pass of FIG. 7A.

FIG. 7C depicts threshold voltage distributions after a failed second program pass of a program operation which follows the first program pass of FIG. 7A.

FIG. 8A depicts threshold voltage distributions representing an erased (Er) state and an intermediate (INT) state after a first program pass of a program operation, where the INT state is reached with a verify test using a verify voltage VINT.

FIG. 8B depicts threshold voltage distributions after a failed second program pass of a program operation which follows the first program pass of FIG. 8A.

FIG. 9 depicts example bit assignments for different data states in an eight state or three bit per cell memory device, consistent with FIGS. 7A-7C, 8A and 8B.

FIG. 10A depicts threshold voltage distributions representing an erased (Er) state and intermediate states (INT1-INT3) after a first program pass of a program operation, where the INT1-INT3 states are reached without a verify test.

FIG. 10B depicts threshold voltage distributions representing the erased (Er) state and programmed states S1-S15 after a successful second program pass of a program operation which follows the first program pass of FIG. 10A.

FIG. 10C depicts threshold voltage distributions representing an erased (Er) state and intermediate states (INT1-INT3) after a first program pass of a program operation, where the INT1-INT3 states are reached with verify tests using verify voltages VINT1-VINT3.

FIG. 11 depicts example bit assignments for different data states in a sixteen state or four bit per cell memory device, consistent with FIG. 10A-10C.

FIG. 12A depicts a flowchart of an example program operation which includes storing a copy of one or more initial pages of data in a first backup set of memory cells, with an option to also store SLC data in a second backup set of memory cells, to allow recovery of the one or more initial pages of data in the event of a power loss.

FIG. 12B depicts a flowchart of an example use of latches in a program operation consistent with FIG. 12A.

FIG. 13A depicts a flowchart of an example implementation of FIG. 12A, step 1201.

FIG. 13B depicts program pulses applied to a primary block and a first backup block, consistent with FIG. 13A.

FIG. 15A depicts example voltage signals applied to a block in the process of FIG. 13A, where a verify test is not performed.

FIG. 16A depicts an example encoding of INT1-INT3 states to SLC states, consistent with FIG. 12A, step 1202.

FIG. 16B depicts an example encoding of a lower page (LP) of data and a middle page (MP) of data to SLC data, consistent with FIG. 16A.

FIG. 16C depicts an example table for decoding of SLC data to obtain a lower page (LP) of data and a middle page (MP), consistent with FIG. 16B.

FIG. 16D depicts a flowchart of an example implementation of FIG. 12A, steps 1201 and 1203, where the programming of the SLC data is separate from the programming of the one or more initial pages of data.

FIG. 16E depicts example program pulses applied to a primary block and backup blocks, consistent with FIG. 16D.

FIG. 16F depicts a table of program pulses consistent with FIG. 16E.

FIG. 17A depicts a flowchart of an example implementation of FIG. 12A, steps 1201 and 1203, where the programming of the SLC data is concurrent with the programming of the one or more initial pages of data.

FIG. 17B depicts example program pulses applied to a primary block and backup blocks, consistent with FIG. 17A.

FIG. 17C depicts a table of program pulses consistent with FIG. 17B.

FIG. 20A depicts a flowchart of an example implementation of FIG. 18, step 1802.

FIG. 20B depicts example program pulses applied to a primary block and backup blocks, consistent with FIG. 20A.

FIG. 20C depicts a table of program pulses, consistent with FIG. 20B.

FIG. 22A depicts threshold voltage distributions representing an erased (Er) state and foggy versions of states S1-S15 after a foggy program pass of a program operation, consistent with the process of FIG. 21, where the states are reached without verify tests.

FIG. 22B depicts threshold voltage distributions representing an erased (Er) state and fine versions of states S1-S15 after a fine program pass of a program operation, following the foggy program pass of FIG. 22A, where the states are reached with verify tests.

FIG. 22C depicts example bit assignments for different data states in a sixteen state or four bit per cell memory device, consistent with FIGS. 22A and 22B.

FIG. 23C depicts example program pulses applied to a primary block and backup blocks, consistent with FIG. 22A in a foggy program pass.

FIG. 23D depicts a table of program pulses consistent with FIG. 23C.

FIG. 24A depicts threshold voltage distributions representing an erased (Er) state and foggy versions of states S1-S7 after a foggy program pass of a program operation, where the states are reached without verify tests.

FIG. 24B depicts threshold voltage distributions representing an erased (Er) state and fine versions of states S1-S7 after a fine program pass of a program operation, following the foggy program pass of FIG. 24A, where the states are reached with verify tests.

FIG. 24C depicts example bit assignments for different data states in an eight state or three bit per cell memory device, consistent with FIGS. 24A and 24B.

FIG. 24D depicts example program pulses applied to a primary block and backup blocks, consistent with FIGS. 23A and 24A.

FIG. 24E depicts a table of program pulses, consistent with FIG. 24D.

DETAILED DESCRIPTION

Figure 1A:
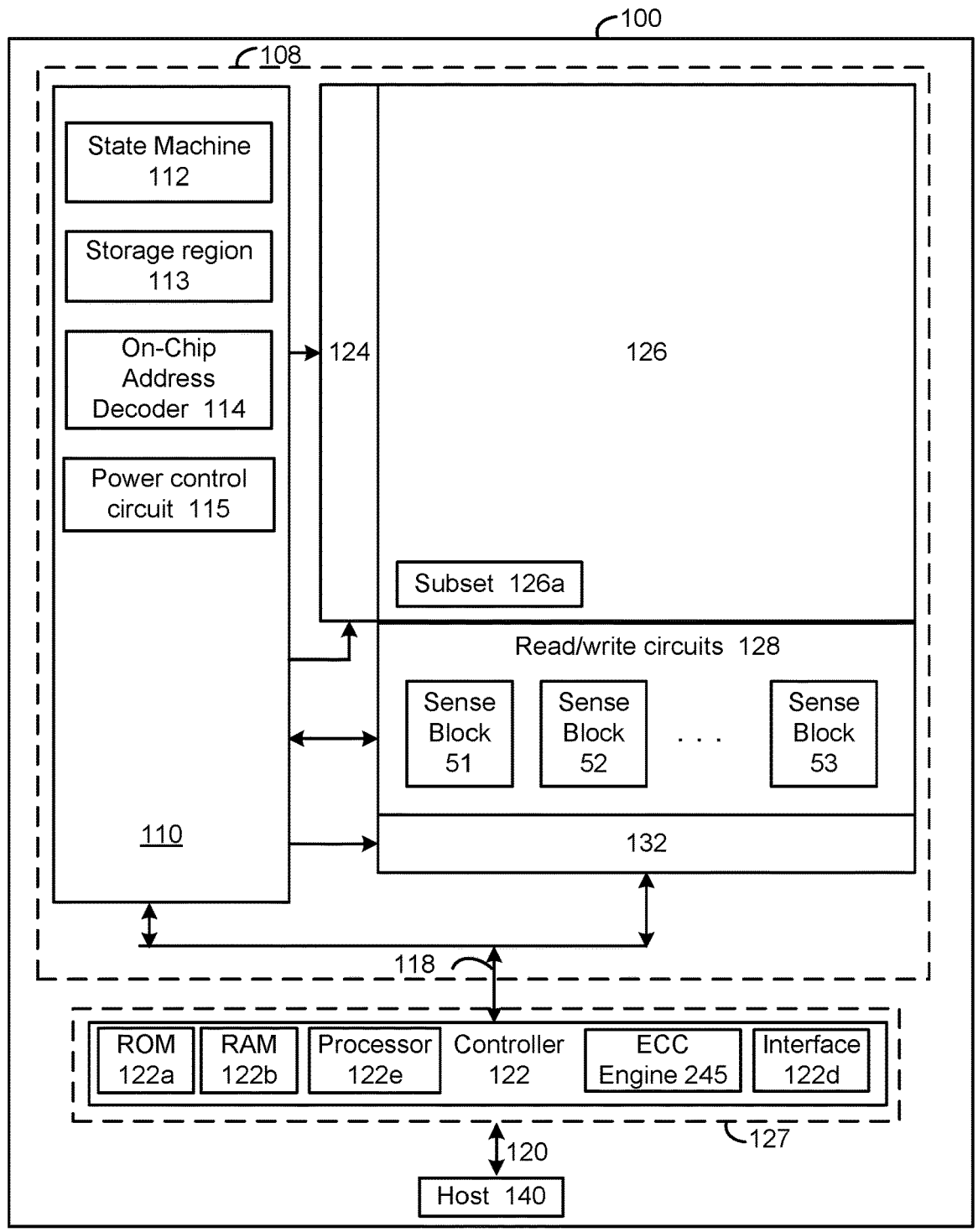
FIG. 1A is a block diagram of an example memory device.

Apparatuses and techniques are described for programming one or more pages of data in a set of memory cells while concurrently storing backup data which can be used to recover the one or more pages of data in the event of a power loss during programming. The techniques are particularly useful for storing backup data for a first program pass in a multi-pass program operation.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The memory cells can include data memory cells, which are eligible to store user data, and dummy memory cells, which are ineligible to store user data. Dummy memory cells are used to reduce disturbs of data memory cells by providing buffer regions along the NAND string.

Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. A source end of the NAND string is connected to the substrate and a drain end of the NAND string is connected to a bit line.

In particular, 3D NAND flash memory is widely used for storage in consumer devices, enterprise systems and industrial applications because of its non-volatility, affordability, high storage density and high access speed.

In a 2D memory structure, the memory cells may be arranged in horizontal NAND strings on a substrate.

Data can be stored in the memory cells by programming them to different data states which are represented by different ranges of threshold voltages (Vths). In a single bit per cell mode, also referred to as a single level cell (SLC) mode, one bit of data is stored in each memory cell. In a multiple bits per cell mode, also referred to as a multi-level cell (MLC) mode, multiple bits of data are stored in each memory cell. Typically, data is stored in units of pages, with one bit per cell per page. A set of memory cells storing N bits of data therefore also stores N pages of data.

As memory devices are scaled down, and interference between word lines increases, it can be difficult to achieve narrow Vth distributions. One solution is to program the memory cells in multiple program passes. Additionally, it is possible to use a back-and-forth word line programming order, e.g., where a first program pass is performed for a selected word line, WLn, followed by one or more program passes on other word lines, followed by a second program pass on WLn. In one approach, in a first program pass, the memory cells connected to a selected word line are programmed from the erased state to one or more intermediate states using one or more initial pages of data, and in a second program pass, the memory cells connected to the selected word line are programmed from the erased state or the one or more intermediate states to the final assigned data states using one or more additional pages of data. The one or more initial pages of data are also needed to perform the second program pass.

The storage capability of a controller which is in charge of the programming may be limited so that the one or more initial pages of data are released, e.g., erased or otherwise rendered unavailable at the controller, to make room for the one or more additional pages of data for programming the same word line. Or, when different portions of a word line are programmed in one sub-block at a time, the data for one sub-block is released to make room for data of another sub-block. In this case, to perform the second program pass, the memory cells are read to recover the one or more initial pages of data. The one or more initial pages of data are an example of first pass data, while the one or more additional pages of data are an example of second program pass data. For the first program pass, data latches associated with the NAND strings are populated with the one or more initial pages of data. For the second program pass, the data latches associated with the NAND strings are populated with both the one or more initial pages of data and the one or more additional pages of data.

However, the one or more initial pages can be corrupted or otherwise rendered unavailable such as in the event of a power loss during the second program pass. The one or more initial pages may also be corrupted due to an overlap between Vth distributions of adjacent states.

Techniques provided herein address the above and other issues. In one aspect, the one or more initial pages of data are stored in an intended set of memory cells, referred to as a primary set of memory cells or storage location, while a copy of the one or more initial pages of data is also stored concurrently in another set of memory cells, referred to as a first backup set of memory cells or storage location. The different sets of memory cells can be in different blocks, for example. If a power loss occurs which corrupts the one or more initial pages of data in the primary set of memory cells after the first program pass and after the data is released by the controller, the copy of the one or more initial pages of data can be read directly from the first backup set of memory cells. Optionally, a second backup set of memory cells is used to store SLC data which is obtained from the one or more initial pages of data and is used to help distinguish data in overlapping adjacent Vth distributions in the first backup set of memory cells.

In another aspect, SLC data is obtained from encoding the one or more initial pages of data and stored in different backup sets of memory cells, instead of storing a copy of the one or more initial pages of data. The SLC data can be stored concurrently with the programming of the one or more initial pages of data. If a power loss occurs which corrupts the one or more initial pages of data in the primary set of memory cells after the first program pass and after the data is released by the controller, the one or more initial pages of data can be recovered by reading and decoding the SLC data in the backup sets of memory cells.

In another aspect, the programming involves a first, foggy program pass followed by a second, fine program pass, where the same one or more pages of data are used for each program pass. SLC data is obtained from encoding the pages of MLC data and stored in different backup sets of memory cells, instead of storing a copy of the pages of MLC data. The SLC data can be stored concurrently with the programming of the pages of MLC data. If a power loss occurs which corrupts the pages of MLC data in the primary set of memory cells after the foggy program pass and after the data is released by the controller, the pages of MLC data can be obtained by reading and decoding the SLC data in the backup sets of memory cells.

Due to use of concurrent programming, there is little or no time penalty. Further, the use of SLC data as a backup tends to be more robust and less error prone than MLC data, while storing a copy of MLC data requires fewer backup sets of memory cells due to a higher store density.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically, a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a storage region 113, an on-chip address decoder 114 and a power control circuit 115.

In one embodiment, the state machine is programmable by operational parameters and software/code stored in the storage region 113. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is said to be committed or released to the block of memory cells. The RAM 122b may store one or more word lines of data. One approach to erasing data involves marking the data for a garbage collection process.

For example, in the techniques described herein, one or more initial pages of data can be stored in the RAM for use in a first program pass. Once the first program pass is successfully completed, the one or more initial pages of data are released and therefore no longer available from the RAM. One or more additional pages of data can then be stored in the RAM for use in a second program pass.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 6. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
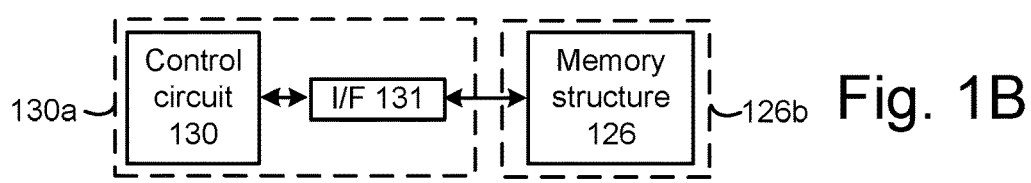
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3A to provide the voltage signals described herein and to implement the techniques discussed herein.

The term "memory die" can refer to a semiconductor die that contains non-volatile memory cells for storage of data.

The term, "control circuit die" can refer to a semiconductor die that contains control circuitry for performing memory operations on non-volatile memory cells on a memory die. Typically, numerous semiconductor die are formed from a single semiconductor wafer.

Figure 2:
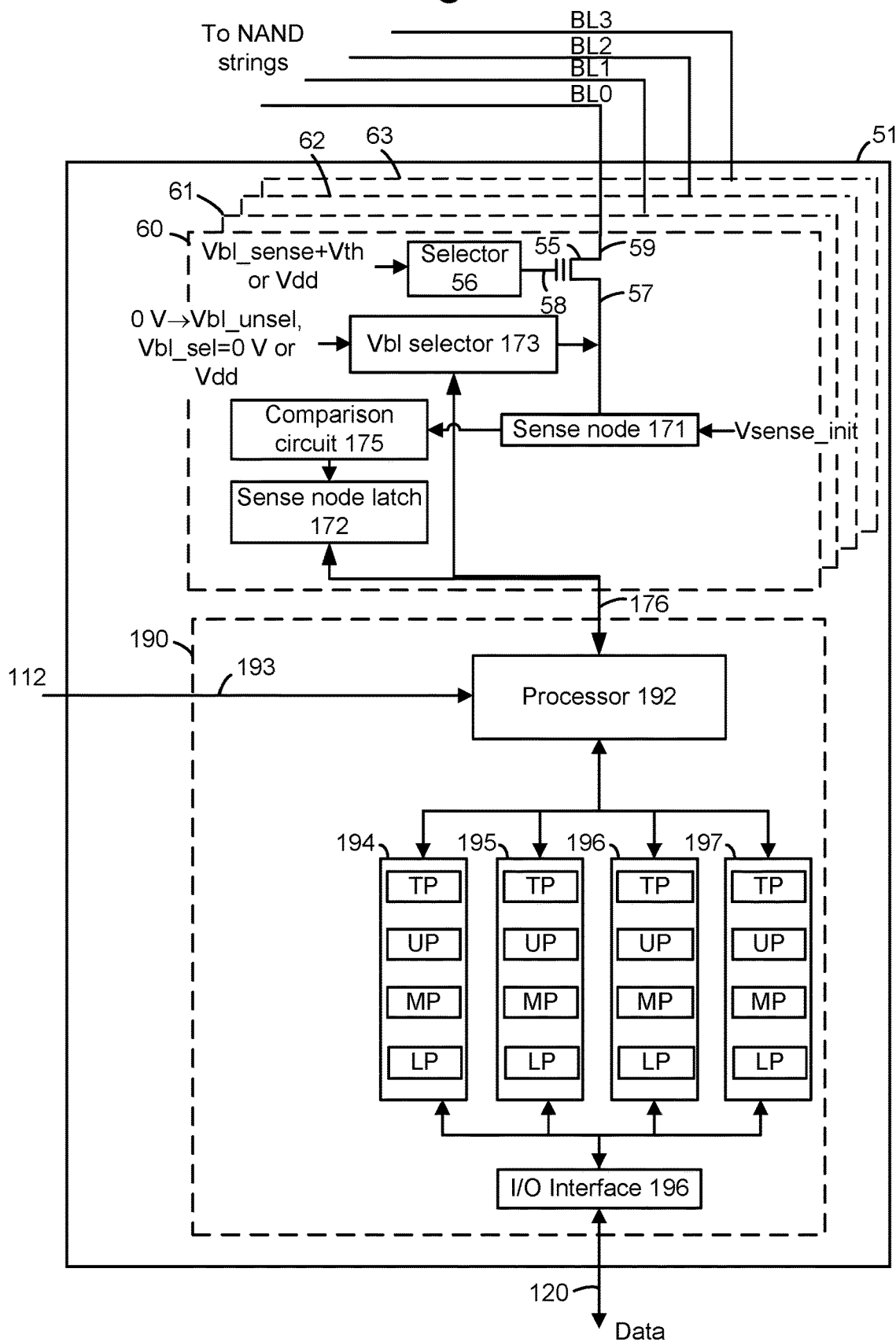
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIGS. 5A and 5B, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. A verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vsense+Vth, e.g., 1.5 V, to the control gate of the transistor 55 to provide Vsense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_unsel for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3A based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a scan operation, or flipped from 0 to 1 in a fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of four data latches, e.g., comprising individual latches LP, MP, UP and TP, can be provided for each sense circuit in a four bit per cell implementation. One set of three data latches comprising LP, MP and UP can be provided for each sense circuit in a three bit per cell implementation. In some cases, a different number of data latches may be used. LP stores a bit for a lower page of data, MP stores a bit for a middle page of data, UP stores a bit for an upper page of data, and TP stores a bit for a top page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LP latches can be used to store a lower page of data. An LP latch is flipped (e.g., from 0 to 1) when a lower page bit is stored in an associated memory cell. For three bits per cell, an MP or UP latch is flipped when a middle or upper page bit, respectively, is stored in an associated memory cell. This occurs when an associated memory cell completes programming. The latches can be common to different blocks which share a set of bit lines.

Figure 3A:
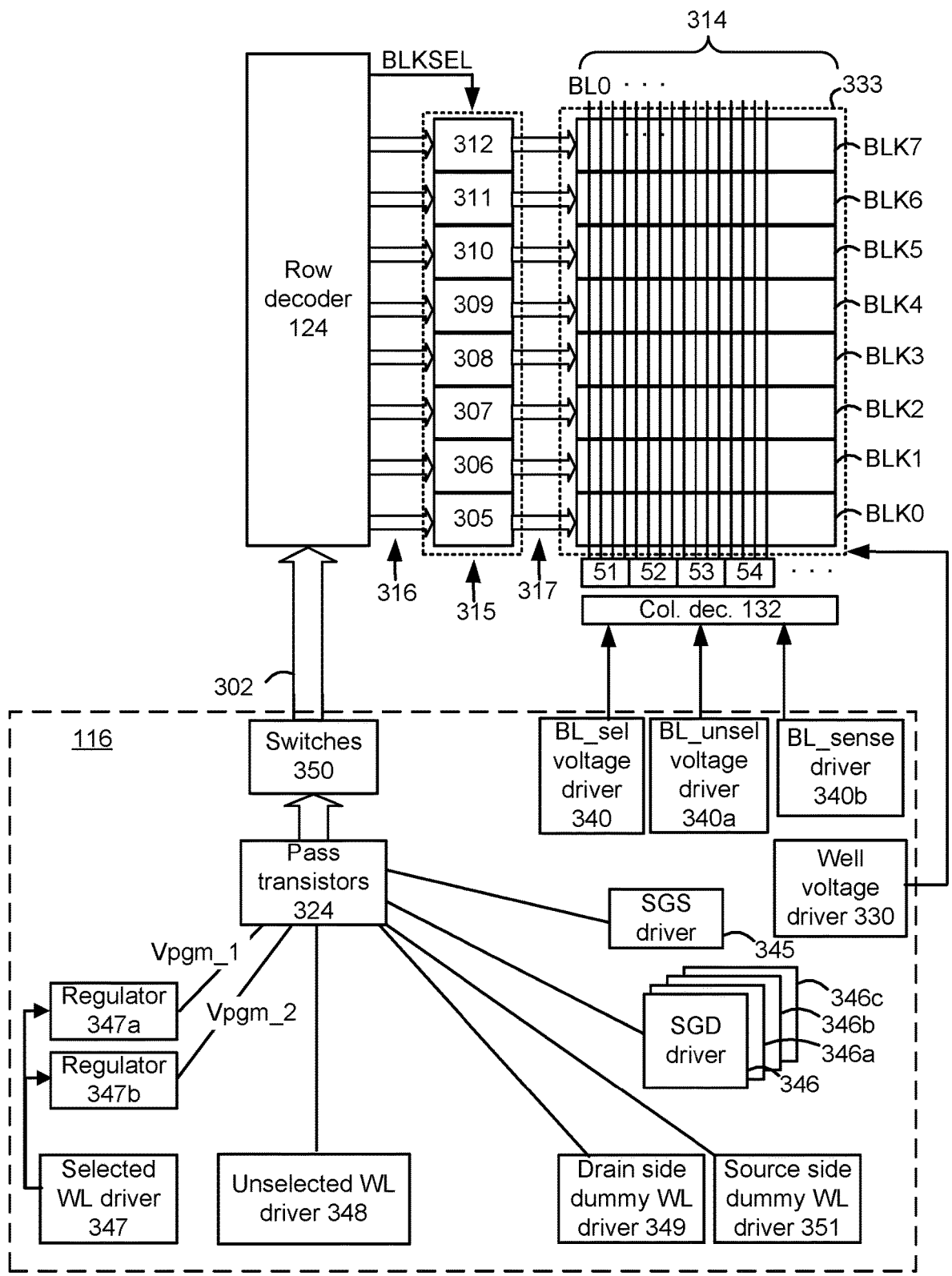
FIG. 3A depicts an example implementation of the power control circuit 115 of FIG. 1A for providing voltages to blocks of memory cells in a plane.

FIG. 3A depicts an example implementation of the power control module 116 of FIG. 1 for providing voltages to blocks of memory cells. In this example, the memory structure 126 includes a set of eight blocks, BLK0-BLK7 in a plane represented by a well region 333 in the substrate. Sense blocks 51, 52, 53, 54 . . . are connected to a set of bit lines 314 at one end of the set of blocks. The column decoder 132 is connected to the sense blocks.

The row decoder 124 of FIG. 1 provides voltages to word lines and select gates of each block via sets of pass transistors 315. Each block BLK0-BLK7 has a respective set of pass transistors 305-312, respectively. The row decoder 124 provides a block select (BLKSEL) control signal to the pass transistors to connect one or more of the blocks to the row decoder. The BLKSEL signal therefore selects one or more blocks for an operation such as programming, for example. Each block can be selected or unselected independently of other blocks, in one approach. In another approach, groups of blocks are selected or unselected together. BLKSEL can provide a common control gate voltage for the pass transistors of each block such that the pass transistors for a block are either all on or off at a given time. If the pass transistors of a block are on (conductive), a voltage from the row decoder is provided to the respective control gate lines or word lines of the block. If the pass transistors of a block are off (non-conductive), the row decoder is disconnected from the respective control gate lines or word lines of the block so that the voltage floats on the respective control gate lines or word lines. The pass transistors connect word lines 317 to the row decoders via conductive paths 316.

Typically, program or read operations are performed on one selected block at a time and on one selected sub-block of the block. With some of the techniques disclosed herein, programming occurs concurrently for two or more blocks. In this case, BLKSEL selects the multiple blocks being programmed to allow the row decoder to provide word line voltages to the two selected blocks concurrently. The voltage for the selected word lines in each selected block can be the same or different. For example, the two voltage regulators 347a and 347b can concurrently provide two separate program voltage signals Vpgm_1 and Vpgm_2, respectively. Additional regulators can be used to provide additional program voltages. Having multiple different program voltages available concurrently provides flexibility in programming the primary and backup blocks with optimum margins between states.

The voltage regulators can receive an output voltage of the selected data WL voltage driver 347. The voltages regulators can be bypassed to allow the output voltage to pass to the row decoder 124. Or, the voltages regulators can be activated to regulate the output voltage and provide a regulated output voltage to the row decoder 124. In another option, one voltage regulator is bypassed and the other is activated. See FIG. 3B.

In another approach, separate voltage drivers are used to provide the separate program voltage signals.

An erase operation may be performed on a selected block or sub-block. The row decoder can connect global control lines 302 to local control lines 317. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected word line (WL) driver 347, which provides a voltage on a data word line selected during a program or read operation. The voltage driver can comprise a charge pump, for example. As mentioned, multiple regulators such as the regulators 347a and 347b can be used to provide the program voltage at different levels concurrently for use in programming different blocks. The voltage drivers can also include a driver 348 for unselected word lines. These can be remaining, unselected word lines other than the selected word line. The voltage drivers can also include a drain-side dummy word line driver 349 which provides voltages on drain-side dummy word lines such as WLDD0 and WLDD1, and a source-side dummy word line driver 351 which provides voltages on source-side dummy word lines such as WLDS1 and WLDS0. See FIG. 5A.

The voltage drivers can also include separate SGD drivers for each sub-block in a block. For example, SGD drivers 346, 346a, 346b and 346c can be provided for SB0, SB1, SB2 and SB3, respectively, of BLK0 such as in FIGS. 5A and 5B. In one option, one SGS driver 345 is common to the different sub-blocks in a block. In another option, separate SGS drivers are provided for each sub-block of a block. Moreover, in some cases, such as a depicted in FIG. 5A, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach. Or, for simplicity, the multiple SGD transistors may be connected and commonly driven, the multiple SGS transistors may be connected and commonly driven, the multiple drain side dummy memory cells may be connected and commonly driven and the multiple source side dummy memory cells may be connected and commonly driven.

The various components, including the row decoder, may receive commands from a controller such as the state machine 112 or the controller 122 to perform the functions described herein.

In one approach, the well region 333 (see also FIG. 3A) is common to the blocks and may be driven by a voltage driver 330. A set of bit lines 314 is also shared by the blocks. During a program operation, a BL_sel bit line voltage driver 340 provides voltages to the selected bit lines and a BL_unsel bit line voltage driver 340a provides voltages to the unselected bit lines. These bit line drivers can also be disconnected from respective bit lines to allow the bit line voltage to float. During a sensing operation, a BL_sense bit line voltage driver 340b provides voltages to the bit lines.

Figure 4:
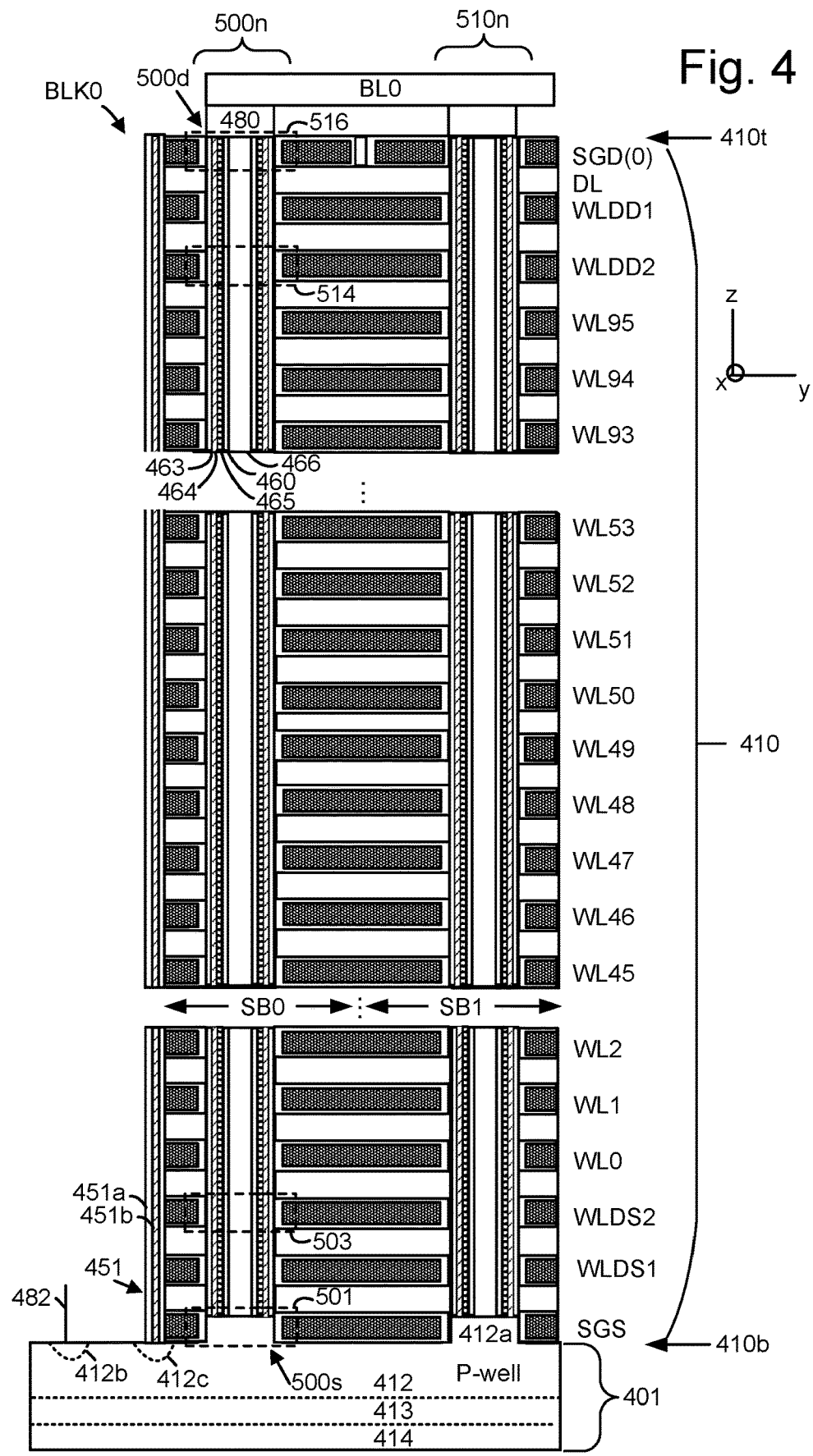
FIG. 4 depicts an example cross-sectional view of a portion of BLK0 of FIG. 3A, including NAND strings 500n and 510n, in a single-tier stack.

In a stacked memory device such as depicted in FIGS. 4 and 5A, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach. The vertically extending NAND strings have a floating channel.

FIG. 3B depicts an example implementation of the voltage regulators 347a and 347b of FIG. 3A. In the voltage regulator 347a, a bandgap circuit 360 provides a reference voltage at a desired level of a program voltage, e.g., Vpgm_1, to an inverting input of a differential amplifier 361 such as an operational amplifier. The output of the differential amplifier is provided to a switch 362 which is conductive or non-conductive based on a first control signal CTRL1. When the switch is conductive, the output of the amplifier is provided to the control gate of a pMOSFET 363 (a switch), and a feedback path is created from the output of the amplifier to the non-inverting input of the amplifier. This regulates the output of the pMOSFET to Vpgm_1, the output of the bandgap circuit. The voltage regulator 347a is therefore in an operational state.

When the switch 362 is non-conductive, a ground voltage is provided to the control gate of the pMOSFET 363. The pMOSFET passes Vpgm, so that the regulation is bypassed. The voltage regulator 347a is therefore in a bypass state.

The voltage regulator 347b operates similarly, except a bandgap circuit 370 provides a reference voltage at a desired level of Vpgm_2 to an inverting input of a differential amplifier 371. The output of the differential amplifier is provided to a switch 372 which is conductive or non-conductive based on a second control signal CTRL2. When the switch is conductive, the output of the amplifier is provided to the control gate of a pMOSFET 373, and a feedback path is created which regulates the output of the pMOSFET to Vpgm_2. The voltage regulator 347b is therefore in an operational state.

When the switch 372 is non-conductive, a ground voltage is provided to the control gate of the pMOSFET 373. The pMOSFET passes Vpgm, so that the regulation is bypassed. The voltage regulator 347b is therefore in a bypass state.

FIG. 4 depicts an example cross-sectional view of a portion of BLK0 of FIG. 3A, including NAND strings 500n and 510n, in a single-tier stack. In this example, the NAND strings 500n and 510n are in different sub-blocks SB0 and SB1, respectively, and are connected to a common bit line, BL0. The block comprises a stack 410 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. The data word lines are separated by dielectric layers. DL is an example dielectric layer.

The conductive layers connected to control gates of dummy memory cells are referred to as dummy word lines. Dummy memory cells can have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to an interface, above and below the interface.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 410t and bottom 410b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, a topmost data memory cell 514 is formed where the WL95 word line intersects with the multiple thin layers, and a bottom most data memory cell 503 is formed where the WL0 word line intersects with the multiple thin layers.

The multiple thin layers can form annular layers and can be deposited, e.g., using atomic layer deposition. For example, the layers can include a blocking oxide layer 463, a charge-trapping layer 464 or film such as silicon nitride (Si3N4) or other nitride, a tunnel oxide layer 465 (e.g., a gate oxide) and a channel 460 (e.g., comprising polysilicon). A dielectric core 466 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 401. In one approach, the substrate includes a p-well region 412 (see also FIG. 3A) connected to the source ends of the NAND strings. The p-well region may comprise epitaxial regions 412a which extend upward adjacent to the source-side select gate transistors. The p-well region can include an n+ contact 412c connected to a local interconnect 451 for receiving a source line voltage, and a p+ contact 412b connected to a conductive path 482 for receiving a p-well voltage. The local interconnect 451 can comprise a conductive material 451b such as metal surrounded by insulating material 451a to prevent conduction with the metal of the adjacent word lines. The p-well region is formed in an n-well 413, which in turn is formed in a p-type semiconductor region 414 of the substrate, in one possible implementation.

The NAND string 500n has a source end 500s at a bottom 410b of the stack 410, connected to the p-well. The NAND string 500n also has a drain end 500d at a top 410t of the stack, connected to a bit line BL0 via a bit line contact 480 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer, e.g., a tunnel oxide layer. The Vth of a memory cell is increased in proportion to the amount of stored charge. During an erase operation, the channels of the NAND string are charged up, such as by applying a positive erase pulse to the substrate via the local interconnect 451, causing the electrons to return to the channel from the charge trapping layer.

In this example, the SGS transistors do not include the multiple thin layers.

FIG. 5A depicts an example view of NAND strings in BLK0 which is consistent with FIG. 4. The NAND strings are arranged in sub-blocks of the block in a 3D configuration. Each sub-block includes multiple NAND strings, where one example NAND string is depicted. For example, SB0, SB1, SB2 and SB3 comprise example NAND strings 500n, 510n, 520n and 530n, respectively. The NAND strings have data word lines, dummy word lines and select gate lines consistent with FIG. 4. Each sub-block comprises a set of NAND strings which extend in the x direction and which have a common SGD line or control gate layer. The NAND strings 500n, 510n, 520n and 530n are in sub-blocks SB0, SB1, SB2 and SB3, respectively. Programming of the block may occur based on a word line and sub-block programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

The plurality of memory cells of BLK0 are arranged in NAND strings, where each NAND string comprising a continuous charge trapping layer along a length of the NAND string. The NAND strings 500n, 510n, 520n and 530n have channels 500a, 510a, 520a and 530a, respectively. Additionally, NAND string 500n includes SGS transistor 501, source-side dummy memory cells 502 and 503, data memory cells 504-513, drain-side dummy memory cells 514 and 515 and SGD transistor 516. NAND string 510n includes SGS transistor 521, source-side dummy memory cells 522 and 523, data memory cells 524-533, drain-side dummy memory cells 534 and 535 and SGD transistor 536. NAND string 520n includes SGS transistor 541, source-side dummy memory cells 542 and 543, data memory cells 544-553, drain-side dummy memory cells 554 and 555 and SGD transistor 556. NAND string 530n includes SGS transistor 561, source-side dummy memory cells 562 and 563, data memory cells 564-573, drain-side dummy memory cell 574 and 575 and SGD transistor 576.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2 and SB3 may be driven by separate control lines SGD(0), SGD(1), SGD (2) and SGD(3), respectively, in one approach.

FIG. 5B depicts an example top view of BLK0 of FIG. 5A, with respective NAND strings, bit lines and sense circuits. The view is in the x-y plane. Each circle represents a NAND string. In this example, sixteen NAND strings per sub-block are depicted. SB0 includes the NAND string 500n of FIG. 5A and additional NAND strings 500n1-500n15. SB1 includes the NAND string 510n of FIG. 5A and additional NAND strings 510n1-510n15. SB2 includes the NAND string 520n of FIG. 5A and additional NAND strings 520n1-520n15. SB3 includes the NAND string 530n of FIG. 5A and additional NAND strings 530n1-530n15.

A set of bit lines BL0-BL15 are connected to the NAND strings. Each bit line is connected to a respective set of NAND strings, including one NAND string in each sub-block. For example, BL0 is connected to NAND strings 500n, 510n, 520n and 530n in a set of NAND strings 599, BL1 is connected to NAND strings 500n1, 510n1, 520n1 and 530n1, and so forth. Each bit line is also connected to a respective sense circuit, consistent with the sense circuits 60-63 of FIG. 2. For example, BL0-BL15 are connected to sense circuits SC0-SC15, respectively.

FIG. 6 depicts an example NAND string in a 2D configuration. The techniques discussed herein can be used in a 2D memory device as well as the above-described 3D memory device. The channel in a 2D memory device extends horizontally in the substrate rather than in a vertically extending channel layer. In this example, a substrate 600 includes a p-well 603 within an n-well 602, which in turn is in a p substrate 601. Vp-well and Vcelsrc are provided to the p-well via contacts 610 and 611, respectively. The contact 611 is a source line. The erase pulse can be Vp-well. A NAND string 619 is arranged on the substrate and include select gate transistors and memory cells. For example, the NAND string includes a SGS transistor 620, memory cells 621, 622 and 623 connected to WLDS, WL0 and WL1, respectively, memory cells 624, 625 and 626 connected to WLn−1, WLn and WLn+1, respectively, memory cells 627 and 628 connected to WL95 and WLDD, respectively, and a SGD transistor 629. Doped regions in the substrate, such as example doped regions 611-617, act as sources and drains of the transistors. Vbl is provided to the doped region 617. When appropriate voltages are provided to the NAND string, an inversion layer or channel 640 is formed in the p-well. A remaining portion 603a of the p-well is biased at Vp-well.

The example memory cell 624 comprises a tunnel oxide layer 630, a floating gate layer 631, a blocking oxide layer 632 and a control gate 633.

FIG. 7A depicts threshold voltage (Vth) distributions representing an erased (Er) state and an intermediate (INT) state after a first program pass of a program operation, where the INT state is reached without a verify test. In this and other figures which depict Vth distributions, the vertical dimension denotes a number of memory cells on a logarithmic scale and the horizontal dimension denotes Vth on a linear scale. As mentioned at the outset, multi-pass programming can be used to provide narrow Vth distributions and reduce interference between memory cells on adjacent word lines.

The memory cells are initially in the erased state as represented by the distribution Er. A first program pass of a program operation is performed which programs some of the memory cells to an intermediate state as represented by the distribution INT while other memory cells remain in the Er state. The programming is based on a lower page of data in which a "1" or "0" bit is assigned to a cell to keep it in the Er state or program it to the INT state, respectively. The page of data can be stored in latches such as the LP latches in FIG. 2. Based on the bit in the latch associated with a NAND string, the controller knows whether a memory cell in the NAND string should remain in the Er state or be programmed. In one approach, the programming involves a single program pulse without a verify pulse, as this saves time. This results in a relatively wide Vth distribution for the INT state.

FIG. 7B depicts threshold voltage distributions representing the erased (Er) state and programmed states S1-S7 after a successful second program pass of a program operation which follows the first program pass of FIG. 7A. Based on the combined data of LP, MP and UP, and consistent with FIG. 9, some memory cells remain in the Er state, some memory cells are programmed from the Er state to the lower programmed states S1-S3, and some memory cells are programmed from the INT state to the higher programmed states S4-S7. The memory cells are programmed to the final data states with verify tests using verify voltages VS1-VS7. The Vth transitions of the second program pass are reduced since some of the cells are programmed from the INT state to S4-S7 rather than from Er to S4-S7. This reduces interference between word lines and results in narrower Vth distributions. The Er state and the S1-S7 states are examples of final assigned data states. These are the data states which the memory cells reach at a conclusion of the program operation.

FIG. 7C depicts threshold voltage distributions after a failed second program pass of a program operation which follows the first program pass of FIG. 7A. As mentioned, a power loss or other event can occur during the second program pass which corrupts the data. A power loss can be detected by a power loss event which is set at a controller or state machine, for example. For example, a power loss may occur after a few program pulses have been applied. In particular, a Vth distribution 710 represents memory cells assigned to the S1-S3 states and a Vth distribution 715 represents memory cells assigned to the S4-S7 states. Since the program pulses increase in magnitude, the lower program pulses which are applied before the power loss result in significant programming of the memory cells assigned to the lower programmed states but not the memory cells assigned to the higher programmed states. Due to an overlap between the Vth distributions 710 and 715, the LP of data cannot be read to distinguish the cells assigned a "1" bit and the cells assigned a "0" bit in the lower page. Further, as mentioned, since the LP is released from the controller after the successful completion of the first program pass, the LP is unavailable unless a backup copy is stored.

One option is to store each page of the MLC data in a separate location as SLC data and then fold the SLC data into another location in an MLC program operation. The SLC data is stored reliably in the non-volatile memory cells so that it is not lost during a power loss. However, this approach has a time penalty and requires a more complicated firmware. The techniques discussed herein allow the MLC data to be programmed directly without a folding operation, while also providing a recovery capability in the event of a power loss.

FIG. 8A depicts threshold voltage distributions representing an erased (Er) state and an intermediate (INT) state after a first program pass of a program operation, where the INT state is reached with a verify test using a verify voltage VINT. One potential solution to the corrupted data of FIG. 7C is to program the cells with a "0" bit in the LP to a narrow INT distribution using multiple program-verify iterations which each perform a verify test using a verify voltage VINT.

FIG. 8B depicts threshold voltage distributions after a failed second program pass of a program operation which follows the first program pass of FIG. 8A. A Vth distribution 720 represents memory cells assigned to the S1-S3 states and a Vth distribution 725 represents memory cells assigned to the S4-S7 states. Since the INT distribution is at a higher level than in FIG. 7A, an overlap can potentially be avoided between the Vth distributions 720 and 725, allowing the LP to be read. However, this approach results in a significant time penalty due to the use of multiple program-verify iterations. Moreover, the LP data will eventually be corrupted as additional program pulses are applied in the second program pass so that there is no guarantee that the LP can be read back after a power loss.

FIG. 9 depicts example bit assignments for different data states in an eight state or three bit per cell memory device, consistent with FIGS. 7A-7C, 8A and 8B. The table lists pages LP, MP and UP and states Er/S0-S7, with corresponding bits values. LP represents the first pass data and MP and UP represent the second pass data. However, the second pass also requires the LP data to identify the assigned data states. For example, MP=1 and UP=1 can identify the Er or S4 state, without the additional knowledge of whether LP=1 or 0.

FIG. 10A depicts threshold voltage distributions representing an erased (Er) state and intermediate states (INT1-INT3) after a first program pass of a program operation, where the INT1-INT3 states are reached without a verify test. The memory cells are initially in the Er state. A first program pass of a program operation is performed which programs some of the memory cells to one of three possible intermediate states as represented by the distributions INT1-INT3 while other memory cells remain in the Er state. The programming is based on an LP and MP of data. MP/LP=1/1, 0/1, 0/0 and 1/0 denote the Er, INT1, INT2 and INT3 states, respectively. The pages of data can be stored in latches such as the LP and MP latches in FIG. 2. In one approach, the programming involves a single program pulse for each INT state without a verify pulse, e.g., a first, second or third pulse for INT1, INT2 and INT3, respectively. See also, e.g., FIG. 13B.

When memory cells are programmed with a program pulse but no verify test, they achieve relatively wide Vth distributions referred to as natural Vth distributions. The INT distributions are therefore relatively wide and have overlapping regions 1010, 1015 and 1020. The memory cells represented by these overlapping regions typically cannot be resolved to a single INT state, even with ECC processing. The techniques discussed herein address this problem without the need for ECC processing, which can have a time penalty.

The Vth distributions can be read using read voltages VRINT1-VRINT3 which may be designed to coincide with the expected lower tail Vth of the INT1-INT3 states, respectively.

FIG. 10B depicts threshold voltage distributions representing the erased (Er) state and programmed states S1-S15 after a successful second program pass of a program operation which follows the first program pass of FIG. 10A. Based on the data of LP, MP, UP and TP (top page), and consistent with FIG. 11, some memory cells remain in the Er state, some memory cells are programmed from the Er state to S1-S3, some memory cells are programmed from the INT1 state to S4, S5, S8 and S9, some memory cells are programmed from the INT2 state to S6, S7, S10 and S11, and some memory cells are programmed from the INT3 state to S12-S15. In practice, some memory cells in an INT state may already be in the final assigned state so that no further programming is needed. Additionally, in this example, memory cells in INT1 and INT2 are programmed to non-adjacent final states, and memory cells in INT3 are programmed to only adjacent states.

The memory cells are programmed to the final data states with verify tests using verify voltages VS1-VS15. The Er state and the S1-S15 states are examples of final assigned data states.

FIG. 10C depicts threshold voltage distributions representing an erased (Er) state and intermediate states (INT1-INT3) after a first program pass of a program operation, where the INT1-INT3 states are reached with verify tests using verify voltages VINT1-VINT3. The intermediate distributions INT1-INT3 are achieved using program-verify iterations which verify tests using verify voltages VINT1, VINT2, VINT3. As mentioned, this can provide narrower Vth distributions in the first program pass at the expense of a time penalty. The Vth distributions can still overlap after some programming, such that use of backup data are described herein is helpful.

FIG. 11 depicts example bit assignments for different data states in a sixteen state or four bit per cell memory device, consistent with FIG. 10A-10C. The table lists pages LP, MP, UP and TP (top page) and states Er/S0-S15. LP and MP represent the first pass data and UP and TP represent the second pass data. As before, the second program pass also requires the LP and MP data to identify the assigned data states.

FIGS. 11, 22C and 24C are provided according to a Gray code, in which the set of bits varies by only one bit for each successive state. Other options are possible.

FIG. 12A depicts a flowchart of an example program operation which includes storing a copy of one or more initial pages of data in a first backup set of memory cells, with an option to also store SLC data in a second backup set of memory cells, to allow recovery of the one or more initial pages of data in the event of a power loss. The SLC data can be used when there are multiple overlapping INT states such as to distinguish cells having a Vth in the overlap regions 1010, 1015 and 1020 of FIG. 10A. Typically, the INT states overlap when they are programmed without a verify test. If the INT states do not overlap, the option to store SLC data in a second backup set of memory cells can be omitted. Additionally, when the SLC data is stored, it can be stored concurrently with, or separately from, the storing of the one or more initial pages of data. The program operation can involve a first program pass in which the one or more initial pages of data are programmed and a second program pass in which one or more additional pages of data are programmed At step 1200, a host 140 (FIG. 1A) issues a write (program) request with one or more initial pages of data. For example, this can be a LP, or a LP and a MP. The request can be issued to the controller 122, for example. At step 1201, in a first program pass, the controller concurrently programs the one or more initial pages of data in a primary set of memory cells and a first backup set of memory cells. The sets of memory cells can be word lines in different blocks or the same block, for example. See FIG. 14. The sets of memory cells can be different portions of a same word line, for example, in different sub-blocks. In the SLC option at step 1202, the controller determines SLC data from the one or more initial pages of data. This can include encoding or mapping the one or more initial pages of data as MLC data to SLC data, such as depicted in FIGS. 16A and 16B. The SLC data can be maintained by the controller or other circuits such as the sense circuits, and is not stored in the latches, in one approach. In the SLC option at step 1203, the controller programs the SLC data to a second backup set of memory cells, either concurrent with, or separate from, the programming of the one or more initial pages of data at step 1201. In step 1204, the controller releases the one or more initial pages of data after confirming that the first program pass has been successfully completed.

At step 1205, the host issues a write request with one or more additional pages of data. For example, this can be a MP and an UP, or an UP and a TP. A decision step 1206 determines whether the programming of the one or more additional pages of data is interrupted by a power loss or other failure. The interruption can be before or during the programming of the one or more additional pages of data.

If the decision step 1206 is false (F), two options are shown. In a first option, at step 1208, the controller reads the one or more initial pages of data from the primary set of memory cells. In the SLC option at step 1209, the controller reads the SLC data from the second backup set of memory cells and uses it to decode the one or more initial pages of data as read in step 1208. As mentioned, the SLC data can assist in reading memory cells of the first backup set of memory cells whose Vth is in an overlap region between two states. In one approach, the first backup set of memory cells has overlapping threshold voltage distributions, and the decoding distinguishes data states of memory cells of the first backup set of memory cells having threshold voltages in overlapping regions of the overlapping threshold voltage distributions.

At step 1210, in a second program pass, the controller programs the one or more additional pages of data in the primary set of memory cells using combined data including the one or more initial pages of data. The combined data comprises the one or more additional pages of data and the one or more initial pages of data. That is, the latches can be configured with bits from both the one or more initial pages of data and the one or more additional pages of data to allow the second program pass to occur. The latch data, including the one or more initial pages of data, is typically lost when a power loss occurs. A control circuit can be configured to store the one or more additional pages of data and the one or more initial pages of data read from the first backup set of memory cells into latches associated with the primary set of memory cells, where a combination of the one or more additional pages of data and the one or more initial pages of data read from the first backup set of memory cells defines final assigned data states of the primary set of memory cells.

In a second option when decision step 1206 is false, step 1207 is reached. Step 1207 can also be reached when the decision step 1206 is true (T). In step 1207, the controller reads the one or more initial pages of data from the first backup set of memory cells. For example, the read voltages VRINT1-VRINT3 of FIG. 10A may be used. The reading occurs when the power returns, in case there is a power loss.

In the approach of FIG. 12A, the first pass data (e.g., the one or more initial pages of data) is maintained in the memory cells of the primary set of memory cells and the program operation resumes after the power loss with the second program pass, to program the second program pass data (e.g., the one or more additional pages of data) in the memory cells of the primary set of memory cells. This results in a time savings since the first program pass is not repeated. In another option, the program operation is started again at a new set of erased memory cells. In this case, the first program pass and second program pass are performed for the memory cells of the new set of erased memory cells. For example, the new set of erased memory cells can be on a different word line than a word line of the primary set of memory cells in the same block as the primary set of memory cells. Or, the new set of erased memory cells can be on a different word line than a word line of a backup set of memory cells in the same block as the backup set of memory cells. Or, the new set of erased memory cells can be on a word line in a new block which does not contain the primary set of memory cells or a backup set of memory cells. The new block can be connected to the same latches which store the one or more initial pages of data and the one or more additional pages of data.

Figure 14:
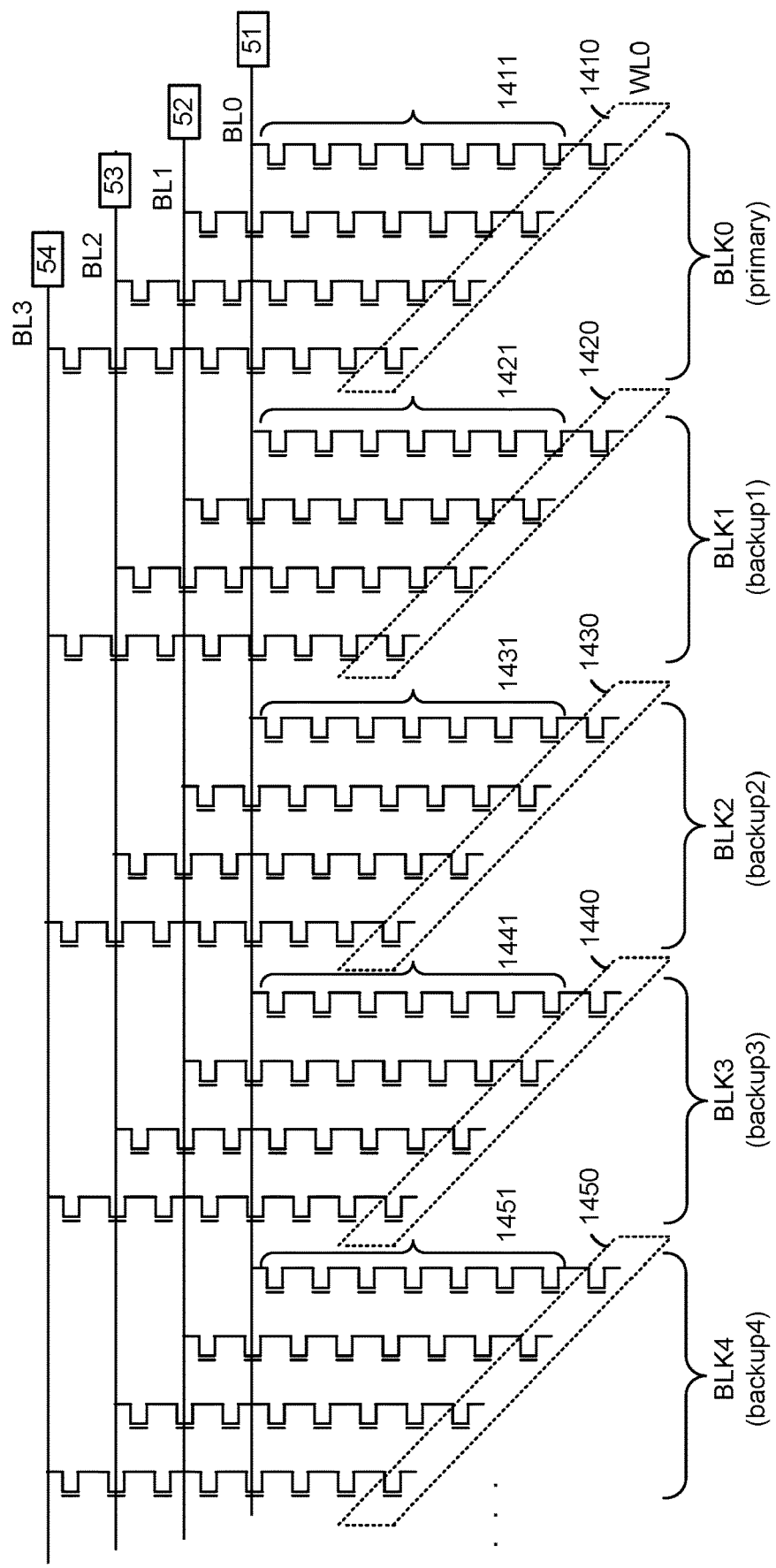
FIG. 14 depicts an example of a primary block and backup blocks consistent with FIG. 13B.

For example, in FIG. 14, BLK0 can comprise a primary set of memory cells 1410, BLK1 can comprise a first backup set of memory cells 1420, BLK2 can comprise a second backup set of memory cells 1430, and BLK3 can comprise a new set of memory cells 1440.

In one approach, the one or more additional pages of data need not be stored in a backup set of memory cells since it is not released by the controller until it has been successfully programmed, and there is no further page to program in the program operation. Thus, if there was another power loss during the programming of the one or more additional pages of data, the data is still available to continue the programming when the power returns.

The first and second program passes can be any passes in a multi-pass program operation, where the second program pass follows the first program pass.

FIG. 12B depicts a flowchart of an example use of latches in a program operation consistent with FIG. 12A. The latches LP, MP, UP and TP of FIG. 2 may be used, for example. These latches are shared by the primary block and one or more backup blocks, typically in a common plane on a substrate. Step 1220 includes loading one or more initial pages of data into the latches. For example, this data can be loaded from the RAM of the controller. Step 1221 includes, in a first program pass, programming the one or more initial pages of data in a primary set of memory cells and a first backup set of memory cells using the data in the latches. Step 1222 notes that the data is lost from the latches during a power loss. Step 1223 includes loading the one or more initial pages of data as read from the first backup set of memory cells, and the one or more additional pages of data, into the latches. Step 1224 includes, in a second program pass, programming the one or more additional pages of data in the primary set of memory cells using the data in the latches, e.g., a combination of the one or more additional pages and the one or more initial pages of data as read from the first backup set of memory cells.

FIG. 13A depicts a flowchart of an example implementation of FIG. 12A, step 1201. Step 1300 includes selecting the primary block and the backup block, to select the primary set of memory cells and the backup set of memory cells. For example, BLKSEL (FIG. 3A) can be used. In this example, the primary and backup sets of memory cells are in different respective blocks. Step 1301 includes concurrently applying program pulses to selected word lines of the primary block and the backup block.

FIG. 13B depicts program pulses applied to a primary block and a first backup block, consistent with FIG. 13A. A set of program pulses 1310 (a first program voltage signal) is applied to the primary block while a set of program pulses 1315 (a second program voltage signal) is applied to a first backup set of memory cells (backup1). During the first program pulse, programming is enabled for the memory cells being programmed to INT1 (FIG. 10A) but not INT2 and INT3 in both the primary and backup blocks. During the second program pulse, programming is enabled for the memory cells being programmed to INT2 but not INT1 and INT3 in both the primary and backup blocks. During the third program pulse, programming is enabled for the memory cells being programmed to INT3 but not INT1 and INT2 in both the primary and backup blocks.

The memory cells are programmed to one of the three INT states with a single program pulse and without a verify test in this example. As a result, just three program pulses are used.

Since the blocks share a common set of bit lines, the memory cells in the blocks can be enabled for programming by setting a bit line voltage to 0 V, for example, and the memory cells in the blocks can be inhibited from programming by setting a bit line voltage to 1.5-2 V, for example. The MP and LP data are also depicted.

In this approach, a primary set of memory cells is in a primary block of memory cells, a first backup set of memory cells is in a first backup block of memory cells, and a common set of bit lines is connected to the primary block of memory cells and the first backup block of memory cells.

The successive program pulses may increase in magnitude, from Vpgm1-Vpgm3, in an incremental step pulse programming process.

FIG. 14 depicts an example of a primary block and backup blocks consistent with FIG. 13B. The primary block is BLK0 and first through fourth backup blocks are BLK1-BLK4, respectively. One or more backup sets of memory cells are used in the techniques disclosed herein. The selected word line in each block is WL0 as an example. However, the selected word lines can be different in each block. BLK0-BLK4 include sets of memory cells 1410, 1420, 1430, 1440 and 1450, respectively. The set of memory cells 1410 is a primary set of memory cells and the sets of memory cells 1420, 1430, 1440 and 1450 are first, second, third and fourth backup sets of memory cells, respectively. BLK0-BLK4 include sets of unselected word lines 1411, 1421, 1431, 1441 and 1451, respectively. Due to the shared bit lines, NAND strings in different blocks which are connected to a common bit line can be concurrently enabled or inhibited from programming. The blocks can be in a common plane on a substrate.

FIG. 15A depicts example voltage signals applied to a block in the process of FIG. 13A, where a verify test is not performed. The voltage signals can be applied to a primary set of memory cells and a backup set of memory cells. Vbl is a bit line voltage which is set to a program (pgm) or inhibit level at t0-t2. VWL_sel is a selected word line voltage which is increased to a peak program level, Vpgm, at t1-t2, to allow programming. The voltage can step up initially to a pass voltage, Vpass, at t0-t1. Vsgd is set to a positive voltage which provides the SGD transistors in a conductive state to allow programming. VWL_unsel is an unselected word line voltage which is increased to Vpass to allow programming.

Vsgs is a voltage of the SGS transistors which is kept at 0 V. Vcelsrc is a voltage of the source line which is set to a positive voltage. Vsgs and Vcelsrc together bias the SGS transistors to a non-conductive state.

Since the primary set of memory cells and the backup set of memory cells share a common set of bit lines and set of latches, they can be commonly programmed or inhibited during a given program pulse, by setting the bit lines voltages to a program or inhibit voltage.

Figure 15B:
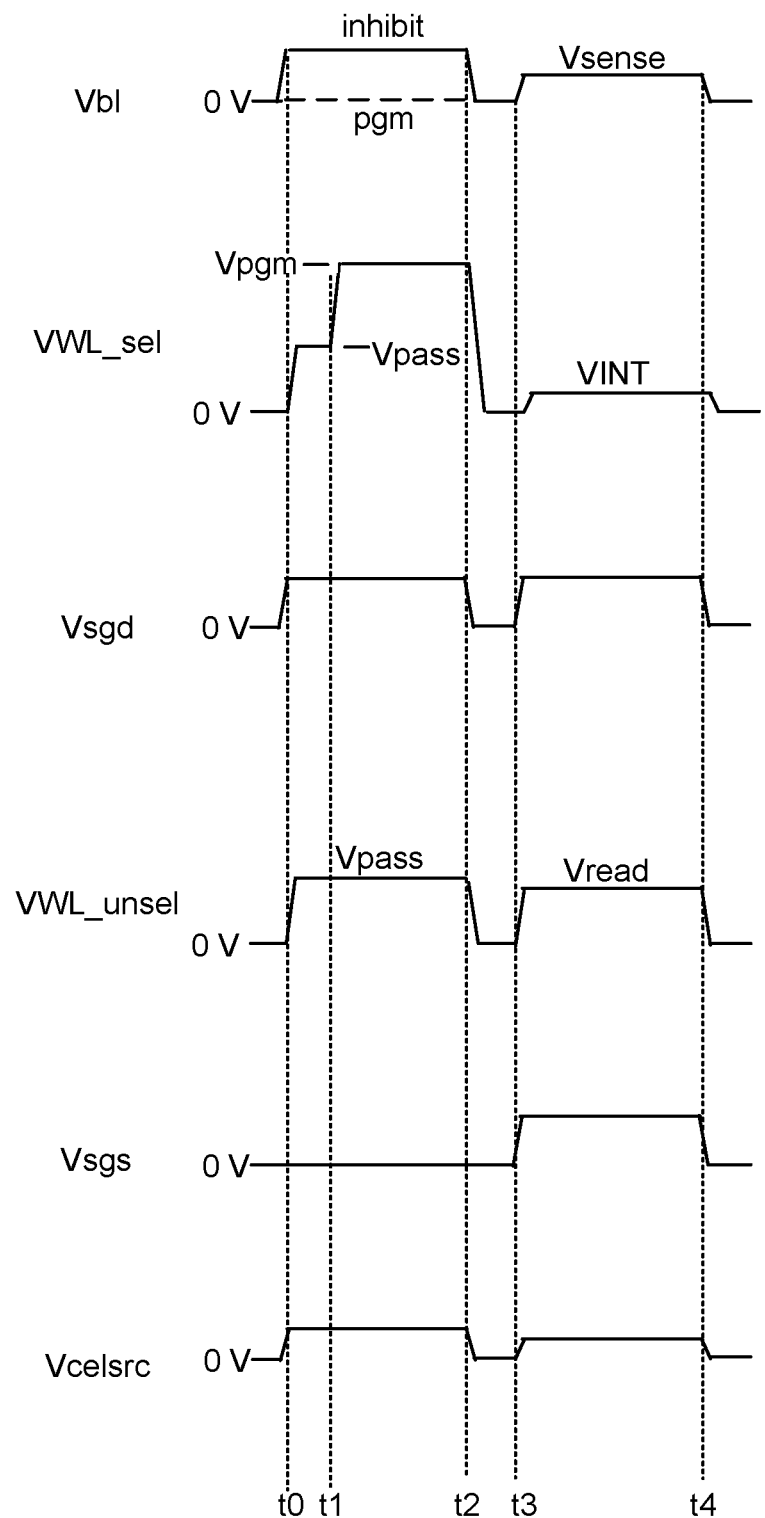
FIG. 15B depicts example voltage signals applied to a block in the process of FIG. 13A, in an option where a verify test is performed.

FIG. 15B depicts example voltage signals applied to a block in the process of FIG. 13A, in an option where a verify test is performed. As mentioned, a verify test can be performed in some cases to provide a narrower Vth distribution in the first program pass, such as in FIG. 10C. Verify tests are also performed in the second program pass to provide the final Vth distributions. The voltage signals depicted represent a program-verify iteration which includes a program portion from t0-t2 and a verify portion or verify test from t3-t4.

Vbl is set to a program or inhibit level in the program portion, and to a sensing level, Vsense, in the verify portion. VWL_sel is set to Vpgm in the program portion and to a verify voltage such as VINT in the verify portion. Vsgd is set to a positive voltage which provides the SGD transistors in a conductive state in both the program portion and the verify portion. VWL_unsel is set to Vpass in the program portion to allow programming and to Vread in the verify portion to allow sensing.

Vsgs is set to 0 V during the program portion and to a positive voltage which allows sensing to occur during the verify portion. Vcelsrc is set to a positive voltage in both the program portion and the verify portion.

When a verify test is performed, the primary and backup sets of memory cells are selected together. For a given bit line, a verify test will sense the current or voltage on the bit line based on contributions of one NAND string in the primary set of memory cells and one NAND string in the backup set of memory cells. If the current is below a threshold, at or close to zero, the verify test is passed. If the current is not below the threshold, an additional program-verify iteration is performed.

The voltage signals of FIGS. 15A and 15B are applicable to any program pass in a multi-pass program operation, and to any number of backup blocks.

FIG. 16A depicts an example encoding of INT1-INT3 states to SLC states, consistent with FIG. 12A, step 1202. The Er state and INT2 state are mapped to the "1" state, and the INT1 state and INT3 state are mapped to the "0" state. Thus, every other state in the distribution of the first program pass is mapped to a common state among SLC data. VR denotes a read voltage which allows the "1" and "0" states to be distinguished. The four states of the first program pass are an example of MLC data based on two initial pages of data, and are represented by an LP and MP of data.

FIG. 16B depicts an example encoding of a lower page (LP) of data and a middle page (MP) of data to SLC data, consistent with FIG. 16A. MP/LP=1/1 maps to SLC=1, MP/LP=0/1 maps to SLC=0, MP/LP=0/0 maps to SLC=1, and MP/LP=1/0 maps to SLC=0. The SLC bit can be obtained from an XNOR (exclusive not-OR) operation of the MP bit and the LP bit.

FIG. 16C depicts an example table for decoding of SLC data to obtain a lower page (LP) of data and a middle page (MP), consistent with FIG. 16B. The MLC data denotes the two initial pages of data as represented by the Er, INT1, INT2 and INT3 distributions. This data is stored in the first backup set of memory cells, backup1. The SLC data denotes the page of SLC data as represented by the "1" and "0" distributions, and is stored in the second backup set of memory cells, backup2. MP/LP/SLC=1/1/1 maps to MP/LP=1/1, MP/LP/SLC=0/1/1 maps to MP/LP=1/1, MP/LP/SLC=0/1/0 maps to MP/LP=0/1, MP/LP/SLC=0/0/0 maps to MP/LP=0/1, MP/LP/SLC=0/0/1 maps to MP/LP=0/0, MP/LP/SLC=1/0/1 maps to MP/LP=0/0, and MP/LP/SLC=1/0/0 maps to MP/LP=1/0. Note how the additional of the SLC bit or flag allows the LP and MP to be recovered.

Each bit of the MP can be obtained according to: MP=NOT(Read INT1) OR Read VRINT3, where Read INT1=1 or 0 for a cell having a Vth below or equal/above, respectively, VRINT1, and Read VRINT3=1 or 0 for a cell having a Vth below or equal/above, respectively, VRINT3. Each bit of the LP can be obtained according to: LP=NOT (Read INT2) where Read INT2=1 or 0 for a cell having a Vth below or equal/above, respectively, VRINT2.

FIG. 16D depicts a flowchart of an example implementation of FIG. 12A, steps 1201 and 1203, where the programming of the SLC data is separate from the programming of the one or more initial pages of data. Step 1610 includes selecting the primary block and the first backup block. Step 1611 includes concurrently applying a first program pulse, Vpgm1, to selected word lines of the primary block and the first backup block. Step 1612 includes concurrently applying a second program pulse, Vpgm2, to selected word lines of the primary block and the first backup block. Step 1613 includes concurrently applying a third program pulse, Vpgm3, to selected word lines of the primary block and the first backup block. Step 1614 includes selecting a second backup block. Step 1615 includes applying a fourth program pulse, Vpgm4, to a selected word line of the second backup block.

FIG. 16E depicts example program pulses applied to a primary block and backup blocks, consistent with FIG. 16D. A set of program pulses 1620 (a first program voltage signal) is applied to the primary block while a set of program pulses 1625 (a second program voltage signal) is applied to a backup1 and a program pulse 1630 (a third program voltage signal) is applied to backup2. During the first program pulse (Vpgm1), programming is enabled for the memory cells being programmed to INT1 (FIG. 10A) but not INT2 and INT3 in both the primary and backup1 blocks. During the second program pulse (Vpgm2), programming is enabled for the memory cells being programmed to INT2 but not INT1 and INT3 in both the primary and backup1 blocks. During the third program pulse (Vpgm3), programming is enabled for the memory cells being programmed to the INT3 state but not the INT1 and INT2 state in both the primary and backup1 blocks. During the fourth program pulse (Vpgm4), programming is enabled for the memory cells being programmed to SLC state "0" in the backup2 block.

The successive program pulses for the primary and backup1 sets of memory cells may increase in magnitude, from Vpgm1-Vpgm3, in an incremental step pulse programming process. The program pulse magnitude for backup2, Vpgm4, can be different from the program pulses for the primary and backup1 sets of memory cells, and can be optimized for SLC programming. For example, Vpgm4 can be set to provide a relatively large margin between the erased state and the programmed state in the backup2 block.

The memory cells are programmed with a single program pulse and without a verify test. The MP and LP data are also depicted.

FIG. 16F depicts a table of program pulses consistent with FIG. 16E. The blocks are listed along with an indication of whether the block is selected (S) or unselected (U) for programming. The primary block or set of memory cells and the backup1 block or set of memory cells are selected during pulses 1-3, and the backup2 block is selected during pulse 4.

Generally, during the programming of the one or more initial pages of data into the primary set of memory cells, the programming of the first backup set of memory cells, and the programming of the second backup set of memory cells, a control circuit is configured to identify each of the primary set of memory cells, the first backup set of memory cells and the second backup set of memory cells as being selected or unselected during each program pulse of a set of program pulses. The table can be maintained by the controller, for example.

FIG. 17A depicts a flowchart of an example implementation of FIG. 12A, steps 1201 and 1203, where the programming of the SLC data is concurrent with the programming of the one or more initial pages of data. Programming the SLC data concurrently avoids a time penalty but may require the availability of an additional selected word line voltage. The fourth program pulse of FIG. 16E is omitted. Step 1700 includes selecting the primary block and the first and second backup blocks. Step 1701 includes concurrently applying Vpgm1 to selected word lines of the primary block and the first backup block, and Vpgm1+x to the selected word line of the second backup block. "x" is a value which indicates that a different program voltage can be used. Step 1702 includes selecting the primary block and the first backup block. Step 1703 includes concurrently applying Vpgm2 to selected word lines of the primary block and the first backup block. Step 1704 includes selecting the primary block and the first and second backup blocks. Step 1705 includes concurrently applying Vpgm3 to the selected word lines of the primary block and the first backup block, and Vpgm3+y to the selected word line of the second backup block. "y" is a value which indicates that a different program voltage can be used.

FIG. 17B depicts example program pulses applied to a primary block and backup blocks, consistent with FIG. 17A. A set of program pulses 1710 (a first program voltage signal) is applied to the primary block while a set of program pulses 1715 (a second program voltage signal) is applied to backup1 and a set of program pulses 1720 (a third program voltage signal) is applied to backup2. During the first program pulse, programming is enabled for the memory cells being programmed to INT1 (FIG. 10A) but not INT2 and INT3 in the primary, backup1 and backup2 blocks. During the second program pulse, programming is enabled for the memory cells being programmed to INT2 but not INT1 and INT3 in the primary and backup1 blocks. During the third program pulse, programming is enabled for the memory cells being programmed to INT3 but not INT1 and INT2 in the primary, backup1 and backup2 blocks.

The program pulse magnitudes Vpgm1+x and Vpgm3+y can be the same or different, and can be optimized for SLC programming.

The MP and LP data are also depicted.

FIG. 17C depicts a table of program pulses consistent with FIG. 17B. The blocks are listed along with an indication of whether the block is selected (S) or unselected (U) for programming. The primary block and the backup1 block are selected during pulses 1-3, and the backup2 block is selected during pulses 1 and 3.

Figure 18:
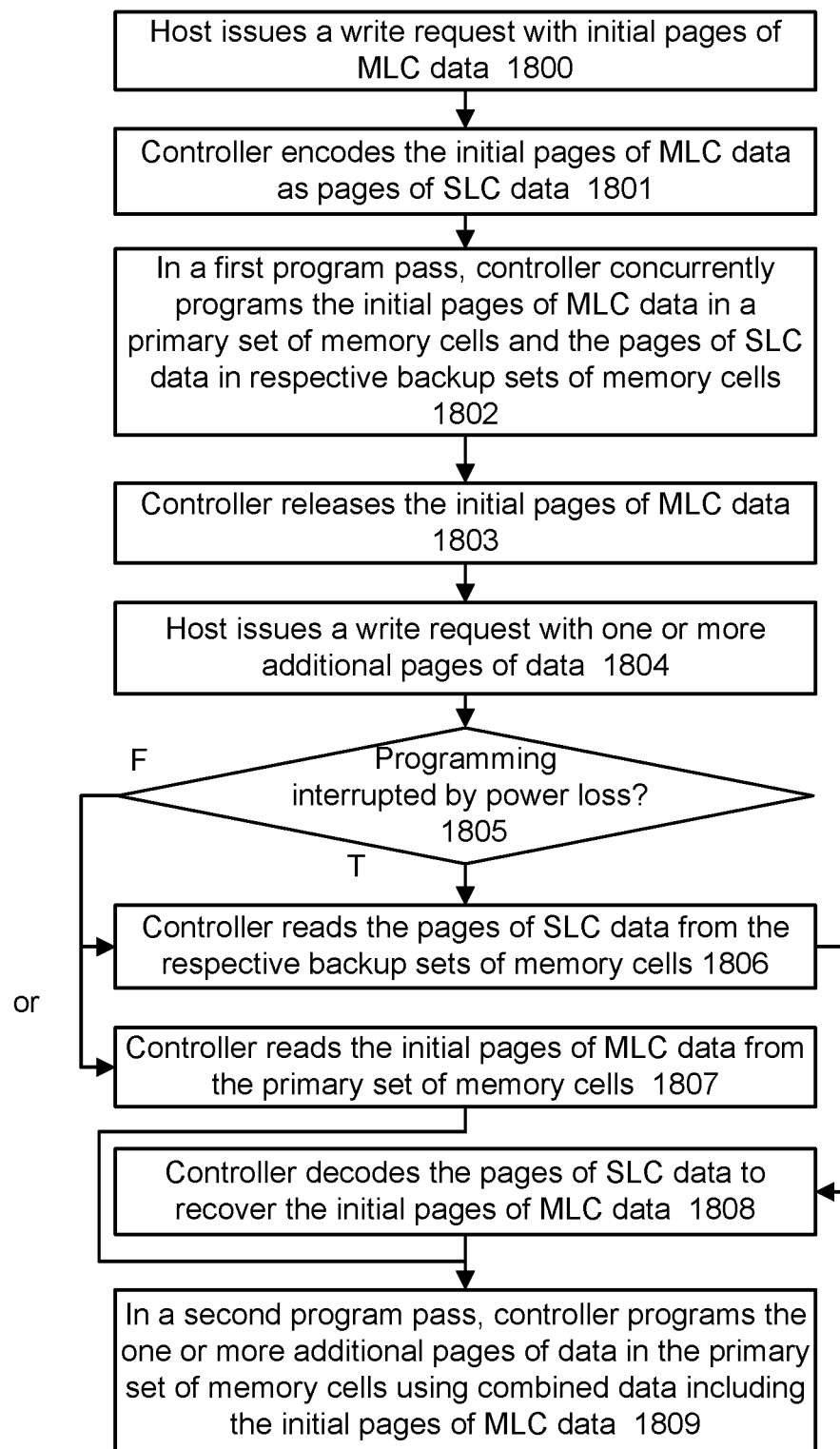
FIG. 18 depicts a flowchart of an example program operation which includes encoding initial pages of MLC data as pages of SLC data and storing the pages of SLC data in respective backup sets of memory cells to allow recovery of the initial pages of MLC data in the event of a power loss.

FIG. 18 depicts a flowchart of an example program operation which includes encoding initial pages of MLC data as pages of SLC data and storing the pages of SLC data in respective backup sets of memory cells to allow recovery of the initial pages of MLC data in the event of a power loss. In this example, the MLC data such as in FIG. 16A is stored one time, in the primary set of memory cells without storing a copy of the MLC data in a backup set of memory cells. Instead, the MLC data is encoded to provide pages of SLC data for storage in respective backup sets of memory cells. The SLC data is more robust, having higher endurance and allowing a greater number of program-erase cycles than MLC data, and less error prone than MLC data due to a larger margin between Vth distributions. At step 1800, the host issues a write request with initial pages of MLC data, e.g., two or more pages. At step 1801, the controller encodes the initial pages of MLC data as pages of SLC data. Generally, each page of the MLC data can be encoded as a page of SLC data.

At step 1802, in a first program pass, the controller concurrently programs the initial pages of MLC data in a primary set of memory cells and the pages of SLC data in respective backup sets of memory cells. The pages of SLC data can be programmed using a table such as in FIG. 20C, which identifies each set of memory cells as being selected or unselected for each program pulse in a set of program pulses. The table can be maintained by the controller or other control circuit. The pages of SLC data need not be stored in the data latches, although this is an option.

At step 1803, the controller releases the initial pages of MLC data.

At step 1804, the host issues a write request with one or more additional pages of data. For example, this can be a MP and an UP, or an UP and a TP. A decision step 1805 determines whether the program operation is interrupted by a power loss or other failure. The interruption can be before or during the programming of the one or more additional pages of data. If the decision step 1805 is false (F), two options are shown. In a first option, at step 1807, the controller reads the initial pages of MLC data from the primary set of memory cells. Subsequently, at step 1809, in a second program pass, the controller programs the one or more additional pages of data in the primary set of memory cells using combined data including the initial pages of MLC data.

In a second option when decision step 1805 is false, step 1806 is reached. Step 1806 can also be reached when the decision step 1805 is true (T). In step 1806, the controller reads the pages of SLC data from the respective backup sets of memory cells. The reading occurs when the power returns, in case there is a power loss. Subsequently, at step 1808, the controller decodes the pages of SLC data to recover the initial pages of MLC data. Step 1809 then follows.

In the approach of FIG. 18, the first pass data (e.g., the one or more initial pages of data) is maintained in the memory cells of the primary set of memory cells, and the program operation resumes after the power loss with the second program pass, to program the second pass data (e.g., the one or more additional pages of data) in the same memory cells of the primary set of memory cells. In another option, the program operation is started again at a new set of memory cells comprising a set of erased memory cells. In this case, the first program pass and second program pass are performed for the memory cells of the new set of memory cells. For example, the new set of memory cells can be on a different word line than a word line of the primary set of memory cells, in the same block as the primary set of memory cells. Or, the new set of memory cells can be on a different word line than a word line of a backup set of memory cells in the same block as the backup set of memory cells. Or, the new set of memory cells can be on a word line in a new block which does not contain the primary set of memory cells or a backup set of memory cells. The new block can be connected to the same latches which store the one or more initial pages of data and the one or more additional pages of data.

A process involving the use of latches in a program operation includes loading the initial pages of MLC data into the latches. The process further includes, in a first program pass, programming the initial pages of MLC data in a primary set of memory cells using the data in the latches. Subsequently, the data is lost from the latches during a power loss. Subsequently, the process includes loading the recovered initial pages of MLC data, and one or more additional pages of data, into the latches. Subsequently, the process includes, in a second program pass, programming the one or more additional pages of data in the primary set of memory cells using the data in the latches, e.g., a combination of the one or more additional pages and the recovered initial pages of MLC data.

Figures 19A, 19B:
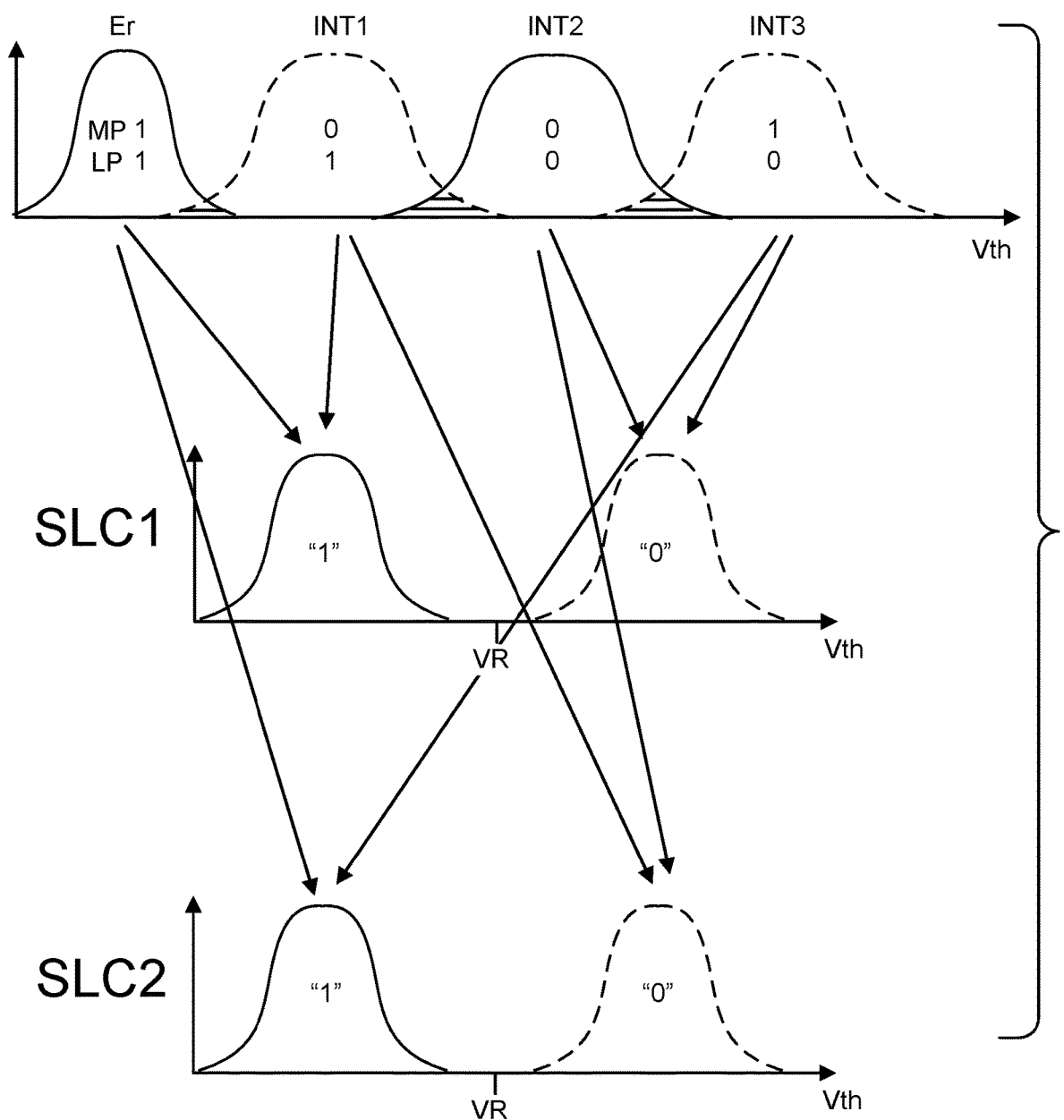
FIG. 19A depicts an example encoding of Er and INT1-INT3 states to SLC states, consistent with FIG. 18, step 1801.
FIG. 19B depicts an example encoding of a lower page (LP) of data and a middle page (MP) of data to first and second pages of SLC data, consistent with FIG. 19A.

FIG. 19A depicts an example encoding of Er and INT1-INT3 states to SLC states, consistent with FIG. 18, step 1801. The Er and INT1-INT3 states represent MLC data comprising a LP and a MP of data. The MLC data is stored in a primary set of memory cells. The MLC data is encoded as a first page of data referred to as SLC1 data and as a second page of data referred to as SLC2 data, and stored in backup sets of memory cells, backup1 and backup2, respectively.

The Er state is mapped to SLC1 and SLC2 state "1" in backup1 and backup2, respectively. The INT1 state is mapped to SLC1 state "1" in backup1 and SLC2 state "0" in backup2. The INT2 state is mapped to SLC1 and SLC2 state "0" in backup1 and backup2, respectively. The INT3 state is mapped to SLC1 state "0" in backup1 and SLC2 state "1" in backup2.

FIG. 19B depicts an example encoding of a lower page (LP) of data and a middle page (MP) of data to first and second pages of SLC data, consistent with FIG. 19A. SLC1 and SLC2 refer to the SLC data in backup1 and backup2, respectively. MP/LP=1/1 maps to SLC1/SLC2=1/1, MP/LP=0/1 maps to SLC1/SLC2=1/0, MP/LP=0/0 maps to SLC1/SLC2=0/0, and MP/LP=1/0 maps to SLC1/SLC2=0/1.

FIG. 20A depicts a flowchart of an example implementation of FIG. 18, step 1802. Step 2000 includes selecting the primary block and the second backup block. Step 2001 includes concurrently applying Vpgm1 to the selected word line of the primary block and Vpgm1+x to the selected word line of the second backup block. Step 2002 includes selecting the primary block and the first and second backup blocks. Step 2003 includes concurrently applying Vpgm2 to the selected word line of the primary block, and Vpgm2+y to the selected word lines of the first and second backup blocks. Step 2004 includes selecting the primary block and the first backup block. Step 2005 includes concurrently applying Vpgm3 to the selected word lines of the primary block, and Vpgm3+y to the selected word line of the first backup block.

FIG. 20B depicts example program pulses applied to a primary block and backup blocks, consistent with FIG. 20A. A set of program pulses 2010 (a first program voltage signal) is applied to the primary block while a set of program pulses 2015 (a second program voltage signal) is applied to backup1 and a set of program pulses 2020 (a third program voltage signal) is applied to backup2. During the first program pulse, programming is enabled for the memory cells being programmed to INT1 (FIG. 19A) but not INT2 and INT3 in the primary and backup2 blocks. During the second program pulse, programming is enabled for the memory cells being programmed to INT2 but not INT1 and INT3 state in the primary, backup1 and backup2 blocks. During the third program pulse, programming is enabled for the memory cells being programmed to INT3 but not INT1 and INT2 in the primary and backup1 blocks.

The MP and LP data are also depicted.

FIG. 20C depicts a table of program pulses, consistent with FIG. 20B. The blocks are listed along with an indication of whether the block is selected (S) or unselected (U) for programming. The primary block is selected during pulses 1-3, the backup1 block is selected during pulses 2 and 3, and the backup2 block is selected during pulses 1 and 2.

Figure 21:
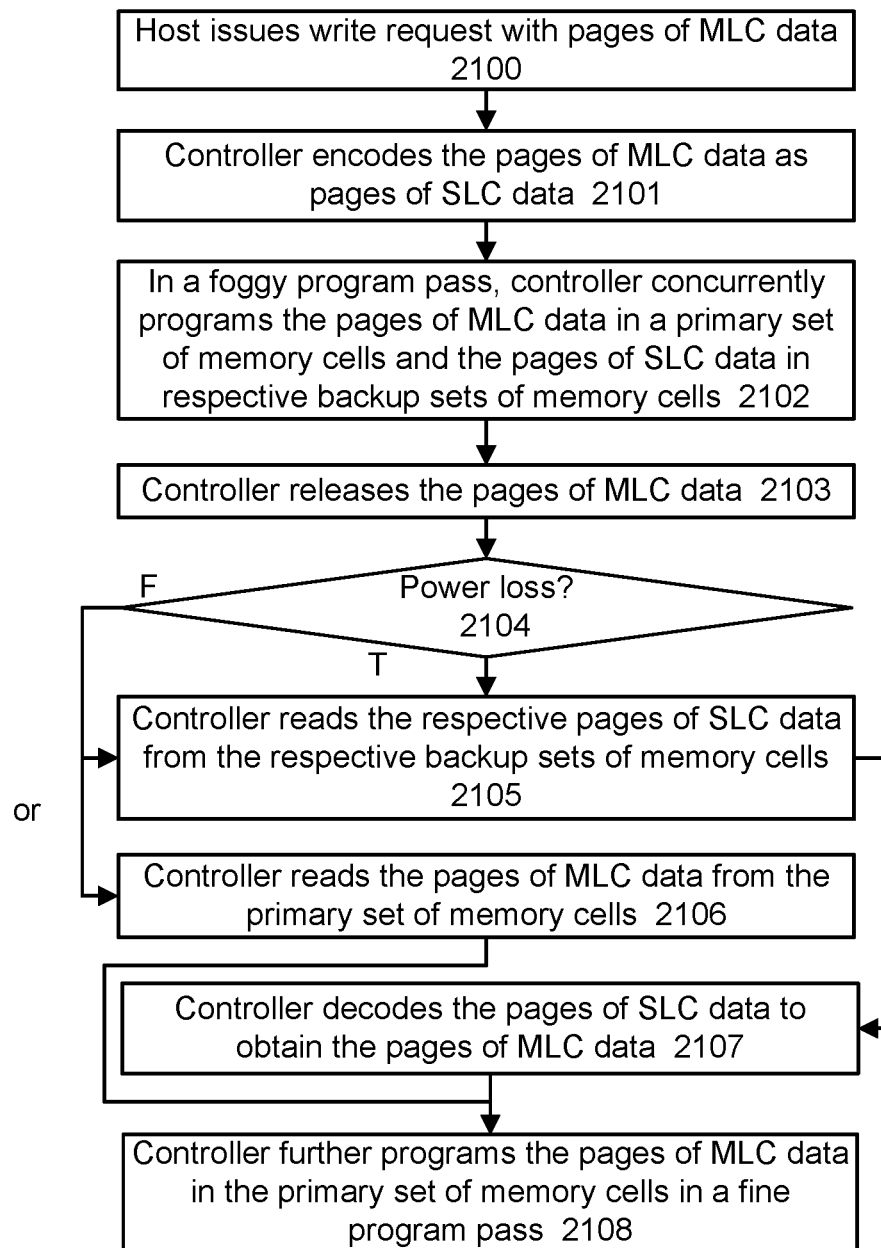
FIG. 21 depicts a flowchart of an example program operation which includes encoding pages of MLC data as pages of SLC data and storing the pages of SLC data in respective backup sets of memory cells to allow recovery of the pages of MLC data in the event of a power loss, where the storing of the pages of SLC data occurs in a foggy program pass.

FIG. 21 depicts a flowchart of an example program operation which includes encoding pages of MLC data as pages of SLC data and storing the pages of SLC data in respective backup sets of memory cells to allow recovery of the pages of MLC data in the event of a power loss, where the storing of the pages of SLC data occurs in a foggy program pass.

In this example, MLC data is stored one time, in the primary set of memory cells. The MLC data is encoded to pages of SLC data for storage in respective backup sets of memory cells. At step 2100, the host issues a write request with initial pages of MLC data, e.g., two or more pages. At step 2101, the controller encodes the initial pages of MLC data as pages of SLC data. Generally, each page of MLC data is encoded as a page of SLC data.

At step 2102, in a foggy program pass, the controller concurrently programs the initial pages of MLC data in a primary set of memory cells and the pages of SLC data in respective backup sets of memory cells. The pages of SLC data can be programmed using a table such as in FIG. 23D which identifies each set of memory cells as being selected or unselected for each program pulse in a set of program pulses. The table can be maintained by the controller or other control circuit. The pages of SLC data need not be stored in the data latches, although this is an option.

At step 2103, the controller releases the initial pages of MLC data.

A decision step 2104 determines whether a power loss occurs, resulting in the loss of the pages of MLC data in the latches. The power loss can be before or during a fine programming pass. If the decision step 2104 is false (F), two options are shown. In a first option, at step 2106, the controller reads the pages of MLC data from the primary set of memory cells. Subsequently, at step 2108, the controller further programs the pages of MLC data in the primary set of memory cells in a fine program pass.

In a second option when decision step 2104 is false, step 2105 is reached. Step 2105 can also be reached when the decision step 2104 is true (T). In step 2105, the controller reads the pages of SLC data from the respective backup sets of memory cells. The reading occurs when the power returns, in case there is a power loss. Subsequently, at step 2107, the controller decodes the pages of SLC data to obtain the pages of MLC data. Step 2108 then follows.

A process involving the use of latches in a program operation includes loading the pages of MLC data into the latches. Subsequently, the process includes, in the foggy program pass, programming the pages of MLC data in a primary set of memory cells using the data in the latches. Subsequently, the data is lost from the latches during a power loss. Subsequently, the process includes loading the recovered pages of MLC data into the latches. In this case, the same pages of data are used for both the foggy and fine program passes so there is no additional page of data to load into the latches, as in prior examples. Subsequently, the process includes, in the fine program pass, programming the pages of MLC data in the primary set of memory cells using the data in the latches.

FIG. 22A depicts threshold voltage distributions representing an erased (Er) state and foggy versions of states S1-S15 after a foggy program pass of a program operation, consistent with the process of FIG. 21, where the states are reached without verify tests. The term "foggy" indicates the Vth distributions are relatively wide and the term "fine" indicates the Vth distributions are relatively narrow. The Vth distributions are typically overlapping.

FIG. 22B depicts threshold voltage distributions representing an erased (Er) state and fine versions of states S1-S15 after a fine program pass of a program operation, following the foggy program pass of FIG. 22A, where the states are reached with verify tests. The verify tests use verify voltages VS1-VS15.

FIG. 22C depicts example bit assignments for different data states in a sixteen state or four bit per cell memory device, consistent with FIGS. 22A and 22B. The table lists pages LP, MP, UP and TP (top page) and states Er/S0-S15. Each page of data is used in both the foggy and fine program passes. If the pages are lost after the foggy programming is completed and the data is released, it can be recovered from the SLC data in the backup sets of memory cells.

Figure 23A:
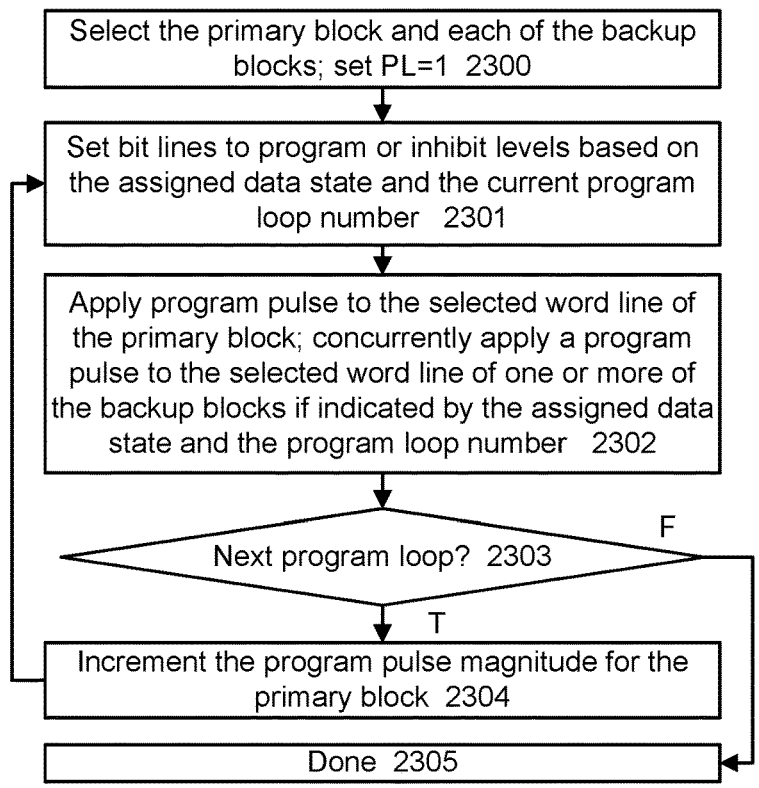
FIG. 23A depicts a flowchart of an example implementation of FIG. 21, step 2102.

FIG. 23A depicts a flowchart of an example implementation of FIG. 21, step 2102 for performing a foggy program pass. Step 2300 selects the primary block and each of the backup blocks; and sets a program loop number PL=1. Step 2301 includes setting the bit lines to program or inhibit levels based on the assigned data state and the current program loop number. Step 2302 includes applying a program pulse to the selected word line of the primary block, and concurrently applying a program pulse to the selected word line of one or more of the backup blocks if indicated by the assigned data state and the program loop number. See, e.g., FIG. 23D. A decision step 2303 determines if there is a next program loop in the program pass. If the decision step is false, the program pass is done at step 2305. If the decision step is true, step 2304 increments the program pulse magnitude for the primary block, and step 2301 is repeated in a next program loop. A fixed program pulse magnitude can be used for the backup blocks.

Figure 23B:
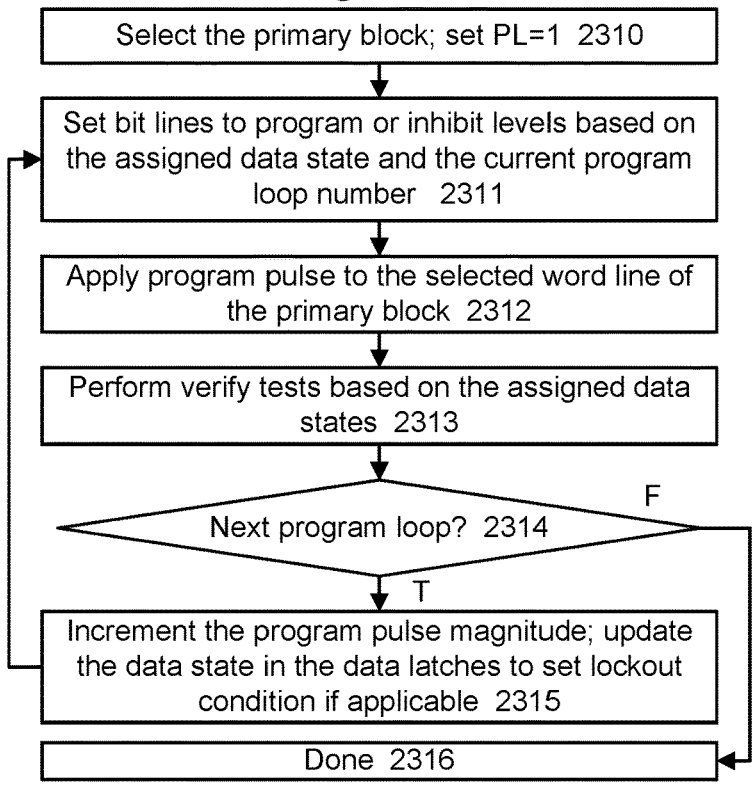
FIG. 23B depicts a flowchart of an example implementation of FIG. 21, step 2108.

FIG. 23B depicts a flowchart of an example implementation of FIG. 21, step 2108 for performing a fine program pass. Step 2310 selects the primary block and sets PL=1. Step 2311 includes setting the bit lines to program or inhibit levels based on the assigned data state and the current program loop number. Step 2312 includes applying a program pulse to the selected word line of the primary block. Step 2313 includes performing verify tests based on the assigned data states. A decision step 2314 determines if there is a next program loop in the program pass. If the decision step is false, the program pass is done at step 2316. If the decision step is true, step 2315 increments the program pulse magnitude for the primary block and updates the data state in the data latches to set a lockout condition, if applicable. For example, the data latches can be updates to all 1's for a memory cell that completes programming to its assigned data state. This indicates the memory cell is in a lockout condition and should be inhibited from further programming such as by setting an elevated bit line voltage when subsequent program pulses are applied. Step 2311 is repeated for the next program loop.

FIG. 23C depicts example program pulses applied to a primary block and backup blocks, consistent with FIG. 22A in a foggy program pass. A set of program pulses 2320 (a first program voltage signal) is applied to the primary block to store the MLC data (LP, MP, UP and TP) while a set of program pulses 2325 (a second program voltage signal) is applied to backup1 to store the LP as SLC data, a set of program pulses 2330 (a third program voltage signal) is applied to backup2 to store the MP as SLC data, a set of program pulses 2335 (a fourth program voltage signal) is applied to backup3 to store the UP as SLC data, and a set of program pulses 2340 (a fifth program voltage signal) is applied to backup4 to store the TP as SLC data.

The program pulse magnitude can increase for the primary set of memory cells according to an incremental step pulse programming technique. The program pulse magnitude can be fixed for the SLC programming of the backup sets of memory cells, in one approach.

FIG. 23D depicts a table of program pulses consistent with FIG. 23C. The blocks are listed along with an indication of whether the block is selected (S) or unselected (U) for programming. The primary block is selected during pulses 1-15, the backup1 block is selected during pulses 5-10, 14 and 15, the backup2 block is selected during pulses 4, 5 and 9-14, the backup3 block is selected during pulses 2-7, 10 and 11, and the backup4 block is selected during pulses 1, 2 and 7-12.

FIG. 24A depicts threshold voltage distributions representing an erased (Er) state and foggy versions of states S1-S7 after a foggy program pass of a program operation, where the states are reached without verify tests. The Vth distributions are typically overlapping.

FIG. 24B depicts threshold voltage distributions representing an erased (Er) state and fine versions of states S1-S7 after a fine program pass of a program operation, following the foggy program pass of FIG. 24A, where the states are reached with verify tests.

FIG. 24C depicts example bit assignments for different data states in an eight state or three bit per cell memory device, consistent with FIGS. 24A and 24B. The table lists pages LP, MP and UP and states Er/S0-S7. Each page of data is used in both the foggy and fine program passes.

FIG. 24D depicts example program pulses applied to a primary block and backup blocks, consistent with FIGS. 23A and 24A. A set of program pulses 2410 (a first program voltage signal) is applied to the primary block to store the MLC data (LP, MP and UP) while a set of program pulses 2415 (a second program voltage signal) is applied to backup1 to store the LP as SLC data, a set of program pulses 2420 (a third program voltage signal) is applied to backup2 to store the MP as SLC data, and a set of program pulses 2425 (a fourth program voltage signal) is applied to backup3 to store the UP as SLC data.

The program pulse magnitude can increase for the primary set of memory cells according to an incremental step pulse programming technique. The program pulse magnitude can be fixed for the SLC programming of the backup sets of memory cells, in one approach.

FIG. 24E depicts a table of program pulses, consistent with FIG. 24D. The blocks are listed along with an indication of whether the block is selected (S) or unselected (U) for programming. The primary block is selected during pulses 1-7, the backup1 block is selected during pulses 1-4, the backup2 block is selected during pulses 2, 3, 6 and 7, and the backup3 block is selected during pulses 3-6.

Accordingly, it can be seen that in one implementation, an apparatus comprises: a control circuit configured to connect to a primary set of memory cells and to a first backup set of memory cells. The control circuit is configured to: concurrently program one or more initial pages of data into the primary set of memory cells and the first backup set of memory cells; release the one or more initial pages of data; after the release of the one or more initial pages of data, detect a power loss and a subsequent recovery from the power loss; after the subsequent recovery from the power loss, read the one or more initial pages of data from the first backup set of memory cells; and program one or more additional pages of data into the primary set of memory cells using combined data comprising the one or more additional pages of data and the one or more initial pages of data read from the first backup set of memory cells.

In another implementation, a method comprises: storing one or more initial pages of data into latches associated with a primary set of memory cells and a first backup set of memory cells; programming the one or more initial pages of data into the primary set of memory cells and the first backup set of memory cells concurrently based on the one or more initial pages of data stored in the latches; reading the one or more initial pages of data from the first backup set of memory cells; storing in the latches, the one or more initial pages of data read from the first backup set of memory cells, and one or more additional pages of data; and programming the one or more additional pages of data into the primary set of memory cells based on the one or more initial pages of data read from the first backup set of memory cells and the one or more additional pages of data stored in the latches.

In another implementation, an apparatus comprises: a control circuit configured to connect to a primary set of memory cells and a first backup set of memory cells; and an interface connected to the control circuit. The control circuit is configured to issue commands via the interface to: concurrently program one or more initial pages of data into the primary set of memory cells and the first backup set of memory cells; detect a power loss and a subsequent recovery from the power loss; after the subsequent recovery from the power loss, read the one or more initial pages of data from the first backup set of memory cells; and program the one or more initial pages of data read from the first backup set of memory cells and one or more additional pages of data into a new set of memory cells.

In another implementation, an apparatus comprises: a control circuit configured to connect to a primary set of memory cells and first and second backup sets of memory cells. The control circuit is configured to: encode initial pages of multiple bit per cell data as at least first and second pages of single bit per cell data; program the initial pages of multiple bit per cell data into the primary set of memory cells, and the first and second pages of single bit per cell data into the first and second backup sets of memory cells, respectively; detect a power loss and a subsequent recovery from the power loss; after the subsequent recovery from the power loss, read the first and second pages of single bit per cell data from the first and second backup sets of memory cells, respectively; decode the first and second pages of single bit per cell data to recover the initial pages of multiple bit per cell data; and program one or more additional pages of data into the primary set of memory cells using combined data comprising the one or more additional pages of data and the recovered initial pages of multiple bit per cell data.

In another implementation, a method comprises: storing initial pages of multiple bit per cell data into a common set of latches associated with a primary set of memory cells, and first and second backup sets of memory cells; encoding the initial pages of multiple bit per cell data as at least first and second pages of single bit per cell data; programming the initial pages of multiple bit per cell data into the primary set of memory cells based on the initial pages of multiple bit per cell data stored in the latches; programming the first and second pages of single bit per cell data into the first and second backup sets of memory cells, respectively; reading the first and second pages of single bit per cell data from the first and second backup sets of memory cells, respectively; based on the reading, decoding the first and second pages of single bit per cell data to recover the initial pages of multiple bit per cell data; storing in the latches, the recovered initial pages of multiple bit per cell data and one or more additional pages of data; and programming the one or more additional pages of data into the primary set of memory cells based on the recovered initial pages of multiple bit per cell data and the one or more additional pages of data stored in the latches.

In another implementation, an apparatus comprises: a control circuit configured to connect to a primary set of memory cells and first and second backup sets of memory cells; and an interface connected to the control circuit. The control circuit is configured to issue commands via the interface to: encode initial pages of multiple bit per cell data as at least first and second pages of single bit per cell data; program the initial pages of multiple bit per cell data into the primary set of memory cells in a foggy program pass; program the first and second pages of single bit per cell data into the first and second backup sets of memory cells, respectively; read the first and second pages of single bit per cell data from the first and second backup sets of memory cells, respectively; decode the first and second pages of single bit per cell data to recover the initial pages of multiple bit per cell data; and program the recovered initial pages of multiple bit per cell data into the primary set of memory cells in a fine program pass.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a primary set of memory cells and first and second backup sets of memory cells, the control circuit is configured to:
encode initial pages of multiple bit per cell data as at least first and second pages of single bit per cell data;
program the initial pages of multiple bit per cell data into the primary set of memory cells, and the first and second pages of single bit per cell data into the first and second backup sets of memory cells, respectively;
detect a power loss and a subsequent recovery from the power loss;
after the subsequent recovery from the power loss, read the first and second pages of single bit per cell data from the first and second backup sets of memory cells, respectively;
decode the first and second pages of single bit per cell data to recover the initial pages of multiple bit per cell data; and
program one or more additional pages of data into the primary set of memory cells using combined data comprising the one or more additional pages of data and the recovered initial pages of multiple bit per cell data.

2. The apparatus of claim 1, wherein:
the power loss occurs during programming of the one or more additional pages of data which starts before the power loss.

3. The apparatus of claim 1, wherein:
the control circuit is configured to release the initial pages of multiple bit per cell data after the programming of the initial pages of multiple bit per cell data and the programming of the first and second pages of single bit per cell data, and before the power loss.

4. The apparatus of claim 3, wherein:
the control circuit comprises a random access memory configured to store the initial pages of multiple bit per cell data; and
to the release the initial pages of multiple bit per cell data, the control circuit is configured to erase the initial pages of multiple bit per cell data from the random access memory.

5. The apparatus of claim 1, wherein:
the control circuit is configured to program the initial pages of multiple bit per cell data into the primary set of memory cells using a first program voltage signal and to concurrently program the first and second pages of single bit per cell data into the first and second backup sets of memory cells, respectively, using second and third program voltage signals, respectively.

6. The apparatus of claim 1, wherein:
the control circuit is configured to store the one or more additional pages of data and the recovered initial pages of multiple bit per cell data in latches associated with the primary set of memory cells; and
a combination of the one or more additional pages of data and the recovered initial pages of multiple bit per cell data defines final assigned data states of the primary set of memory cells.

7. The apparatus of claim 1, further comprising:
a common set of latches associated with the primary set of memory cells and the first and second backup sets of memory cells;
the control circuit is configured to:
   store the one or more additional pages of data and the recovered initial pages of multiple bit per cell data in the common set of latches;
   a combination of the one or more additional pages of data and the recovered initial pages of data read defines final assigned data states of the primary set of memory cells.

8. The apparatus of claim 1, wherein:
the programming of the initial pages of multiple bit per cell data is concurrent with the programming of the first and second pages of single bit per cell data.

9. The apparatus of claim 8, wherein:
during the programming of the initial pages of multiple bit per cell data and the programming of the first and second backup sets of memory cells, the control circuit is configured to identify each of the primary set of memory cells, the first backup set of memory cells and the second backup set of memory cells as being selected or unselected during each program pulse of a set of program pulses.

10. A method, comprising:
storing initial pages of multiple bit per cell data into a common set of latches associated with a primary set of memory cells, and first and second backup sets of memory cells;
encoding the initial pages of multiple bit per cell data as at least first and second pages of single bit per cell data;
programming the initial pages of multiple bit per cell data into the primary set of memory cells based on the initial pages of multiple bit per cell data stored in the latches;
programming the first and second pages of single bit per cell data into the first and second backup sets of memory cells, respectively;
reading the first and second pages of single bit per cell data from the first and second backup sets of memory cells, respectively;
based on the reading, decoding the first and second pages of single bit per cell data to recover the initial pages of multiple bit per cell data;
storing in the latches, the recovered initial pages of multiple bit per cell data and one or more additional pages of data; and
programming the one or more additional pages of data into the primary set of memory cells based on the recovered initial pages of multiple bit per cell data and the one or more additional pages of data stored in the latches.

11. The method of claim 10, wherein:
the reading of the first and second pages of single bit per cell data is triggered by detecting a power loss and a subsequent recovery from the power loss.

12. The method of claim 11, further comprising:
releasing the initial pages of multiple bit per cell data from a random access memory after the programming of the multiple bit per cell data and the programming of the first and second pages of single bit per cell data, and before the power loss.

13. The method of claim 10, further comprising:
programming the initial pages of multiple bit per cell data into the primary set of memory cells using a first program voltage signal and concurrently programming the first and second pages of single bit per cell data into the first and second backup sets of memory cells, respectively, using second and third program voltage signals, respectively.

14. The method of claim 10, wherein:
the programming of the initial pages of multiple bit per cell data is concurrent with the programming of the first and second pages of single bit per cell data.

15. The method of claim 14, further comprising:
during the programming of the initial pages of multiple bit per cell data and the programming of the first and second pages of single bit per cell data, identifying each of the primary set of memory cells, the first backup set of memory cells and the second backup set of memory cells as being selected or unselected during each program pulse of a set of program pulses.

16. An apparatus, comprising:
a control circuit configured to connect to a primary set of memory cells and first and second backup sets of memory cells; and
an interface connected to the control circuit, the control circuit is configured to issue commands via the interface to:
   encode initial pages of multiple bit per cell data as at least first and second pages of single bit per cell data;
   program the initial pages of multiple bit per cell data into the primary set of memory cells in a foggy program pass;
   program the first and second pages of single bit per cell data into the first and second backup sets of memory cells, respectively;
   read the first and second pages of single bit per cell data from the first and second backup sets of memory cells, respectively;
   decode the first and second pages of single bit per cell data to recover the initial pages of multiple bit per cell data; and
   program the recovered initial pages of multiple bit per cell data into the primary set of memory cells in a fine program pass.

17. The apparatus of claim 16, wherein:
the reading of the first and second pages of single bit per cell data is triggered by detecting a power loss and a subsequent recovery from the power loss.

18. The apparatus of claim 16, wherein:
the control circuit is configured to issue a command via the interface to program the initial pages of multiple bit per cell data into the primary set of memory cells in the foggy program pass using a first program voltage signal and to concurrently program the first and second pages of single bit per cell data into the first and second backup sets of memory cells, respectively, using at least a second program voltage signal, respectively.

19. The apparatus of claim 16, further comprising:
a common set of latches associated with the primary set of memory cells and the first and second backup sets of memory cells;
the control circuit is configured to issue a command via the interface to:
   load the initial pages of multiple bit per cell data into the common set of latches before the programming of the initial pages of multiple bit per cell data into the primary set of memory cells in the foggy program pass; and
   load the recovered initial pages of multiple bit per cell data into the common set of latches before the programming of the recovered initial pages of multiple bit per cell data in the fine program pass.

20. The apparatus of claim 19, wherein:
the initial pages of multiple bit per cell data which are loaded in the common set of latches before the programming of the initial pages of multiple bit per cell data into the primary set of memory cells in the foggy program pass, are lost from the latches when the power loss occurs.

\* \* \* \* \*